United States Patent
Yang et al.

(10) Patent No.: US 10,102,805 B2
(45) Date of Patent: Oct. 16, 2018

(54) DRIVING CIRCUIT FOR FULL-COLOR ORGANIC LIGHT-EMITTING DIODE PIXEL AND DRIVING METHOD OF THE DRIVING CIRCUIT

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Haisheng Wang, Beijing (CN); Changfeng Li, Beijing (CN); Wei Liu, Beijing (CN); Yingming Liu, Beijing (CN); Peng Liu, Beijing (CN); Hailin Xue, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 42 days.

(21) Appl. No.: 15/037,746

(22) PCT Filed: Nov. 10, 2015

(86) PCT No.: PCT/CN2015/094183
§ 371 (c)(1),
(2) Date: May 19, 2016

(87) PCT Pub. No.: WO2016/179983
PCT Pub. Date: Nov. 17, 2016

(65) Prior Publication Data
US 2017/0132976 A1    May 11, 2017

(30) Foreign Application Priority Data
May 13, 2015    (CN) .......................... 2015 1 0243720

(51) Int. Cl.
*G09G 3/3258*    (2016.01)
*G09G 3/20*    (2006.01)
(Continued)

(52) U.S. Cl.
CPC ......... *G09G 3/3258* (2013.01); *G09G 3/2003* (2013.01); *G09G 3/3266* (2013.01);
(Continued)

(58) Field of Classification Search
None
See application file for complete search history.

(56) References Cited

U.S. PATENT DOCUMENTS

| 5,757,139 A | 5/1998 | Forrest et al. |
| 7,403,177 B2 | 7/2008 | Tanada et al. |

(Continued)

FOREIGN PATENT DOCUMENTS

| CN | 1246268 | 3/2000 |
| CN | 1702725 A | 11/2005 |

(Continued)

OTHER PUBLICATIONS

Third Chinese Office Action in Chinese Application No. 201510243720.5, dated Nov. 30, 2016 with English translation.
(Continued)

*Primary Examiner* — Kenneth B Lee, Jr.
(74) *Attorney, Agent, or Firm* — Collard & Roe, P.C.

(57) ABSTRACT

A driving circuit for a full-color OLED pixel and a driving method of the driving circuit. The full-color OLED pixel comprises at least two color thin film layers stacked (Color1, Color2, Color3) and insulating layers (Ins1, Ins2) arranged between any two adjacent thin film layers. The driving circuit comprises at least two driving sub-circuits, the at least two driving sub-circuits share a data line (DATA) and a light-emitting control terminal (EM), and each of the driving sub-circuits is connected to a scanning control terminal corresponding thereto (SCAN1, SCAN2, SCAN3) and is configured to drive the color thin film layer corre-
(Continued)

sponding thereto. The at least two driving sub-circuits read data signals on the data line in sequence under the control of the respective scanning control terminals, and drive the respective color thin film layers to emit light concurrently under the control of the light-emitting control terminal. Full-color display of the full-color OLED pixel is achieved by reading in sequence corresponding data signals for the at least two color thin film layers stacked and controlling the at least two color thin film layers to emit light concurrently.

18 Claims, 15 Drawing Sheets

(51) Int. Cl.
    *G09G 3/3266*     (2016.01)
    *H01L 27/32*     (2006.01)

(52) U.S. Cl.
    CPC . *H01L 27/3209* (2013.01); *G09G 2300/0871* (2013.01); *G09G 2320/0666* (2013.01)

(56) References Cited

U.S. PATENT DOCUMENTS

| | | | |
|---|---|---|---|
| 7,528,810 B2 | 5/2009 | Ohshima et al. | |
| 7,535,447 B2 | 5/2009 | Kwak et al. | |
| 7,623,560 B2 | 11/2009 | El-Ghoroury et al. | |
| 2014/0071028 A1 | 3/2014 | Han | |

FOREIGN PATENT DOCUMENTS

| | | | |
|---|---|---|---|
| CN | 1742305 | A | 3/2006 |
| CN | 1790468 | A | 6/2006 |
| CN | 101127194 | A | 2/2008 |
| CN | 101874330 | A | 10/2010 |
| CN | 104269429 | A | 1/2015 |
| CN | 104269431 | A | 1/2015 |
| CN | 104282263 | A | 1/2015 |
| CN | 104795026 | A | 7/2015 |
| JP | 2007-057667 | A | 3/2007 |

OTHER PUBLICATIONS

International Search Report of PCT/CN2015/094183 in Chinese, dated Jan. 27, 2016 with English translation.

Notice of Transmittal of the International Search Report of PCT/CN2015/094183 in Chinese, dated Jan. 27, 2016.

Written Opinion of the International Searching Authority of PCT/CN2015/094183 in Chinese, dated Jan. 27, 2016 with English translation.

First Chinese Office Action in Chinese Application No. 201510243720.5, dated Nov. 26, 2015 with English translation.

Second Chinese Office Action in Chinese Application No. 201510243720.5, dated Jun. 13, 2016 with English translation.

US 10,102,805 B2

DRIVING CIRCUIT FOR FULL-COLOR ORGANIC LIGHT-EMITTING DIODE PIXEL AND DRIVING METHOD OF THE DRIVING CIRCUIT

CROSS REFERENCE TO RELATED APPLICATIONS

This application is the National Stage of PCT/CN2015/094183filed on Nov. 10, 2015, which claims priority under 35 U.S.C. § 119 of Chinese Application No. 201510243720.5 filed on May 13, 2015, the disclosure of which is incorporated by reference.

TECHNICAL FIELD

The present disclosure relates to the technical field of organic light-emitting diode pixel display, and particularly to a driving circuit for a full-color organic light-emitting diode pixel and a driving method of the driving circuit.

BACKGROUND

Organic light emitting diodes AMOLEDs have currently become a hotspot in plate display research. As compared with a liquid crystal display, OLED has advantageous of low power consumption, low production cost, self-luminescent, wide viewing angle and rapid response, etc.

A traditional AMOLED display mainly comprises a substrate and OLED pixel units manufactured on the substrate, each of the OLED pixel units comprises a structure of an OLED pixel per se and a driving circuit for the OLED pixel, and the driving circuit drives the OLED pixel to emit light according to signals on a corresponding gate line and a corresponding data line. FIG. 1 illustrates a schematic structural diagram of an OLED pixel in the prior art. As shown in FIG. 1, the structure of the OLED pixel comprises an anode electrode and a cathode electrode disposed oppositely and a light-emitting thin film layer sandwiched between the anode electrode and the cathode electrode, the light-emitting thin film layer comprises a hole injection layer (HIL), a hole transport layer (HTL), an organic light-emitting material layer (EML), an electron transport layer (ETL) and an electron injection layer (EIL) in sequence along a direction from the anode electrode to the cathode electrode. The OLED pixel is a current driving type light-emitting device, when a driving current flows from the anode electrode to the cathode electrode of the structure of the OLED structure, holes and electrons are combined at the organic light-emitting material layer to release energy, uminescent molecules in the organic light-emitting material layer transit to an excited state from a ground state when being excited, and the molecules in the excited state form photons in the radiative transition from the excited state back to the ground state, thereby luminance phenomenon is generated.

FIG. 2 illustrates a schematic diagram of pixel arrangement of an AMOLED display in the prior art. As shown in FIG. 2, three adjacent OLED pixels in a row are a red pixel, a green pixel and a blue pixel, color display can be achieved by color mixing of the red pixel, the green pixel and the blue pixel, Gate represents a gate line and Data represents a data line in FIG. 2. However, each specific OLED pixel can only display one of three primary colors and only functions as a functional unit in the color display. In other words, the AMOLED display as shown in FIG. 2 fails to really achieve full-color display on a pixel level.

Therefore, there is a need for an OLED pixel structure and an AMOLED display corresponding thereto which are capable of really achieving extreme full-color display.

SUMMARY

In order to solve the above technical problem, the present disclosure proposes a driving circuit for a full-color OLED pixel and a driving method of the driving circuit, which can achieve full-color display by the full-color OLED pixel by reading data signals for at least two color thin film layers stacked in sequence and controlling the at least two color thin film layers to emit light concurrently.

According to one aspect of the present disclosure, there is provided a driving circuit for a full-color OLED pixel. The full-color OLED pixel comprises at least two color thin film layers stacked and insulating layers arranged between any two adjacent thin film layers. The driving circuit comprises at least two driving sub-circuits, the at least two driving sub-circuits share a data line and a light-emitting control terminal, and each of the driving sub-circuits is connected to a scanning control terminal corresponding thereto and is configured to drive the color thin film layer corresponding thereto. The at least two driving sub-circuits read data signals on the data line in sequence under the control of the respective scanning control terminals, and drive the respective color thin film layers to emit light concurrently under the control of the light-emitting control terminal.

According to one embodiment of the present disclosure, the at least two color thin film layers comprise a first color thin film layer, a second color thin film layer and a third color thin film layer, and the at least two driving sub-circuits comprise a first driving sub-circuit connected to a first scanning control terminal, the data line and the light-emitting control terminal and configured to drive the first color thin film layer; a second driving sub-circuit connected to a second scanning control terminal, the data line and the light-emitting control terminal and configured to drive the second color thin film layer; and a third driving sub-circuit connected to a third scanning control terminal, the data line and the light-emitting control terminal and configured to drive the third color thin film layer.

The first driving sub-circuit, the second driving sub-circuit and the third driving sub-circuit read the data signals on the data line in sequence under the control of the first scanning control terminal, the second scanning control terminal and the third scanning control terminal; and the first driving sub-circuit, the second driving sub-circuit and the third driving sub-circuit drive the first color thin film layer, the second color thin film layer and the third color thin film layer respectively to emit light concurrently under the control of the light-emitting control terminal.

According to one embodiment of the present disclosure, each of the driving sub-circuits comprises a data-reading module for reading and storing a data signal on the data line, and a light-emitting driving module for driving a color thin film layer corresponding thereto to emit light.

According to one embodiment of the present disclosure, the data-reading module is further configured to store a threshold voltage of a driving transistor in the light-emitting driving module, and the data-reading module comprises a first switching transistor having a gate connected to the first scanning control terminal, a first electrode connected to the data line and a second electrode connected to a second electrode of the driving transistor; a second switching transistor having a gate connected to the first scanning control terminal and a second electrode connected to a first electrode of the driving transistor; a capacitor having a first electrode connected to a first electrode of the second switching transistor and a second electrode connected to a first level supply terminal.

According to one embodiment of the present disclosure, the light-emitting driving module comprises: a third switching transistor having a gate connected to the light-emitting control terminal, a first electrode connected to the first level supply terminal, and a second electrode connected to the first electrode of the driving transistor and the second electrode of the second switching transistor; a fourth switching transistor having a gate connected to the light-emitting control terminal, a first electrode connected to the second electrode of the driving transistor, and a second electrode connected to a first electrode of the color thin film layer corresponding thereto; and the driving transistor having a gate connected to the first electrode of the capacitor.

According to one embodiment of the present disclosure, the at least two driving sub-circuits further share a resetting control terminal, and each of the driving sub-circuits further comprises a resetting module for resetting the data-reading module in the driving sub-circuit to its initial state under the control of the resetting control terminal.

According to one embodiment of the present disclosure, the resetting module comprises a fifth switching transistor having a gate connected to the resetting control terminal, a first electrode connected to the first electrode of the capacitor and the gate of the driving transistor, and a second electrode connected to a second level supply terminal.

According to another aspect of the present disclosure, there is further provided a driving method of a driving circuit of a full-color OLED pixel, the full-color OLED pixel comprises at least two color thin film layers stacked and insulating layers arranged between any two adjacent thin film layers. The driving circuit comprises at least two driving sub-circuits, the at least two driving sub-circuits share a data line and a light-emitting control terminal, and each of the driving sub-circuits is connected to a scanning control terminal corresponding thereto and is configured to drive the color thin film layer corresponding thereto. The driving method comprises: during a data-reading period, the at least two driving sub-circuits reading data signals on the data line in sequence under the control of the respective scanning control terminals; during a light-emitting period, the at least two driving sub-circuits driving the respective color thin film layers respectively to emit light concurrently under the control of the light-emitting control terminal.

According to one embodiment of the present disclosure, after the light-emitting period or before the data-reading period, the driving method further comprises: during a resetting period, resetting each of the at least two driving sub-circuit to its initial state.

According to one embodiment of the present disclosure, the at least two color thin film layers comprise a first color thin film layer, a second color thin film layer and a third color thin film layer, and the at least two driving sub-circuits comprise a first driving sub-circuit, a second driving sub-circuit and a third driving sub-circuit, the first driving sub-circuit is connected to a first scanning control terminal, the data line and the light-emitting control terminal, the second driving sub-circuit is connected to a second scanning control terminal, the data line and the light-emitting control terminal, and the third driving sub-circuit is connected to a third scanning control terminal, the data line and the light-emitting control terminal.

The at least two driving sub-circuits reading data signals on the data line in sequence under the control of the respective scanning control terminals during a data-reading period comprises: during a first data-reading period, the first driving sub-circuit reading and storing a first data signal on the data line under the control of the first scanning control terminal; during a second data-reading period, the second driving sub-circuit reading and storing a second data signal on the data line under the control of the second scanning control terminal; and during a third data-reading period, the third driving sub-circuit reading and storing a third data signal on the data line under the control of the third scanning control terminal.

The at least two driving sub-circuits driving the respective color thin film layers to emit light concurrently under the control of the light-emitting control terminal during a light-emitting period comprises: during the light-emitting period, the first driving sub-circuit, the second driving sub-circuit and the third driving sub-circuit drive the first color thin film layer, the second color thin film layer and the third color thin film layer respectively to emit light concurrently under the control of the light-emitting control terminal.

According to one embodiment of the present disclosure, during the first data-reading period, the first scanning control terminal is at a low level, the second scanning control terminal and the third scanning control terminal are at a high level, and the light-emitting control terminal is at a high level; during the second data-reading period, the second scanning control terminal is at a low level, the first scanning control terminal and the third scanning control terminal are at a high level, and the light-emitting control terminal is at a high level; during the third data-reading period, the third scanning control terminal is at a low level, the first scanning control terminal and the second scanning control terminal are at a high level, and the light-emitting control terminal is at a high level; during the light-emitting period, the first scanning control terminal, the second scanning control terminal and the third scanning control terminal are at a high level, and the light-emitting control terminal is at a low level.

According to one embodiment of the present disclosure, the at least two driving sub-circuits further share a resetting control terminal, the resetting control terminal is at a low level during a resetting period and is at a high level during the data-reading period and the light-emitting period. During the resetting period, the respective scanning control terminals and the light-emitting control terminal are at a high level.

According to one embodiment of the present disclosure, each of the driving sub-circuits comprises a data-reading module and a light-emitting driving module. The data-reading module comprises: a first switching transistor having a gate connected to the first scanning control terminal, a first electrode connected to the data line and a second electrode connected to a second electrode of a driving transistor in the light-emitting driving module; a second switching transistor having a gate connected to the first scanning control terminal and a second electrode connected to a first electrode of the driving transistor; a capacitor having a first electrode connected to a first electrode of the second switching transistor and a second electrode connected to a first level supply terminal. The light-emitting driving module comprises: a third switching transistor having a gate connected to the light-emitting control terminal, a first electrode connected to the first level supply terminal, and a second electrode connected to the first electrode of the driving transistor and the second electrode of the second switching transistor; a fourth switching transistor having a gate connected to the light-emitting control terminal, a first electrode connected to the second electrode of the driving transistor, and a second electrode connected to a first electrode of the color thin film layer corresponding thereto; and the driving transistor having a gate connected to the first electrode of the capacitor.

According to one embodiment of the present disclosure, the driving sub-circuits share a resetting control terminal, and each of the driving sub-circuits further comprises a resetting module for resetting the data-reading module to its initial state. The resetting module comprises a fifth switching transistor having a gate connected to the resetting control terminal, a first electrode connected to the first electrode of the capacitor and the gate of the driving transistor, and a second electrode connected to a second level supply terminal.

According to one embodiment of the present disclosure, the at least two color thin film layers comprise a first color thin film layer, a second color thin film layer and a third color thin film layer, and the at least two driving sub-circuits comprise a first driving sub-circuit, a second driving sub-circuit and a third driving sub-circuit, the first driving sub-circuit is connected to a first scanning control terminal, the data line and the light-emitting control terminal, the second driving sub-circuit is connected to a second scanning control terminal, the data line and the light-emitting control terminal, and a third driving sub-circuit is connected to a third scanning control terminal, the data line and the light-emitting control terminal.

The at least two driving sub-circuits reading data signals on the data line in sequence under the control of the respective scanning control terminals during a data-reading period comprises: during a first data-reading period, the first scanning control terminal is at a low level, the second scanning control terminal and the third scanning control terminal are at a high level, and the light-emitting control terminal is at a high level, a data signal on the data line is a first data signal, the first switching transistor and the second switching transistor in the first driving sub-circuit are turned on, the driving transistor in the first driving sub-circuit is turned on such that the capacitor stores the first data signal and the threshold voltage of the driving transistor; during the second data-reading period, the second scanning control terminal is at a low level, the first scanning control terminal and the third scanning control terminal are at a high level, and the light-emitting control terminal is at a high level, a data signal on the data line is a second data signal, such that the capacitor in the second driving sub-circuit stores the second data signal and the threshold voltage of the driving transistor in the second driving sub-circuit, the capacitor in the first driving sub-circuit keeps the voltage across its two electrodes unchanged; during the third data-reading period, the third scanning control terminal is at a low level, the first scanning control terminal and the second scanning control terminal are at a high level, and the light-emitting control terminal is at a high level, a data signal on the data line is a third data signal, such that the capacitor in the third driving sub-circuit stores the third data signal and the threshold voltage of the driving transistor in the third driving sub-circuit, the capacitor in the first driving sub-circuit keeps the voltage across its two electrodes unchanged and the capacitor in the second driving sub-circuit keeps the voltage across its two electrodes unchanged.

The at least two sub-circuits driving the respective color thin film layers to emit light concurrently under the control of the light-emitting control terminal during a light-emitting period comprises: during the light-emitting period, the first scanning control terminal, the second scanning control terminal and the third scanning control terminal are at a high level, and the light-emitting control terminal is at a low level, the driving transistor in the first driving sub-circuit is turned on and drives the first color thin film layer to emit light, the driving transistor in the second driving sub-circuit is turned on and drives the second color thin film layer to emit light, and the driving transistor in the third driving sub-circuit is turned on and drives the third color thin film layer to emit light.

According to one embodiment of the present disclosure, during the resetting period, the respective scanning control terminals and the light-emitting control terminal are at a high level, the resetting control terminal is at a low level, the fifth switching transistor in the resetting module of each of the driving sub-circuits is turned on, such that a voltage of the first electrode of the capacitor in each of the driving sub-circuits is reset to a voltage at the second level supply terminal.

According to one embodiment of the present disclosure, for each of the driving sub-circuits, during the data-reading period corresponding thereto, a first current origins from the data line, flows through the first switching transistor, the driving transistor and the second switching transistor in sequence, and arrives at the first electrode of the capacitor in the driving sub-circuit; and during the light-emitting period, a second current origins from the first level supply terminal, flows through the third switching transistor, the driving transistor and the fourth switching transistor in sequence, and arrives at the first electrode of the color thin film layer corresponding to the driving sub-circuit.

According to one embodiment of the present disclosure, for each of the driving sub-circuits, during the data-reading period corresponding thereto, the first current flows from the second electrode of the driving transistor to the first electrode of the driving transistor, during the light-emitting period, the second current flows from the first electrode of the driving transistor to the second electrode of the driving transistor; and for each of the driving sub-circuits, during the light-emitting period, the color thin film layer corresponding thereto is driven to emit light by the data voltage corresponding thereto and the threshold voltage of the driving transistor corresponding thereto stored by the capacitor in the driving sub-circuit, so as to compensate for effect of drift of the threshold voltage of the driving transistor on luminance of the color thin film layer.

According to one embodiment of the present disclosure, the first level supply terminal is a high level supply terminal, the second level supply terminal is a low level supply terminal; and for each of the color thin film layers, the first electrode is an anode, and the second electrode is a cathode and is connected to the second level supply terminal.

According to another aspect of the present disclosure, there is further provided a substrate array comprising an array of full-color OLED pixels, each of the full-color OLED pixels comprises the driving circuit for the full-color OLED pixel described above.

According to yet another aspect of the present disclosure, there is further provided a full-color OLED display comprising the substrate array described above.

Other features and advantageous of the present disclosure will be illustrated in the following specification, and will partially become apparent from the specification or be obtained by implementing the present disclosure. The object and other advantageous of the present disclosure can be achieved and acquired by structures specifically proposed in the specification, claims and the accompanying drawings.

BRIEF DESCRIPTION OF THE DRAWINGS

The above and other objects, features and advantageous of the present disclosure will be apparent from the detailed descriptions on the embodiments of the present disclosure in connection with the accompanying drawings. The accompanying drawings are used to provide further understandings to the embodiments of the present disclosure and constitute a part of the specification, and are used to explain the present disclosure together with the embodiments of the present disclosure rather than constituting limitations to the present disclosure. In the accompanying drawings, same reference signs generally represent same components or steps.

DETAILED DESCRIPTION

In order to make the object, the technical solutions and the advantageous of the embodiments of the present disclosure apparent, the embodiments of the present disclosure will be described below in detail taken in conjunction with the accompanying drawings of the embodiments of the present disclosure. Obviously, the described exemplary embodiments are only some but not all of the embodiments of the present disclosure. Other embodiments obtained by those skilled in the art based on the described embodiments without paying inventive labor shall belong to the scope sought for protection in the present disclosure.

Here, it should be noted that, in the accompanying drawings, same reference signs represent components having substantially same or similar structures or functions and repeated description thereof will be omitted.

According to embodiments of the present disclosure, an OLED pixel structure comprising at least two color display thin film layers stacked is proposed. Particularly, a full-color OLED pixel according to the embodiments of the present disclosure comprises at least two thin film layers stacked and insulating layers arranged between any two adjacent thin film layers. In order to achieve full-color display of the full-color OLED pixel, the at least two film layers and the insulating layers are transparent layers.

Figure 1:
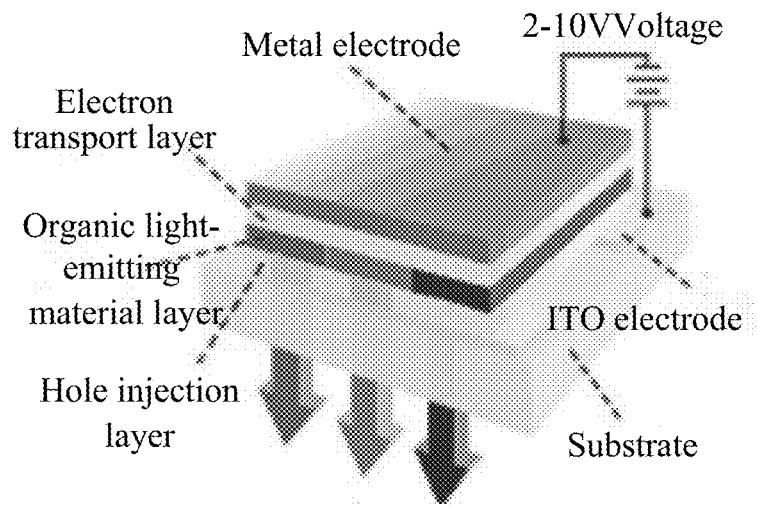
FIG. 1 illustrates a schematic structural diagram of an OLED pixel in the prior art.
Figure 1:
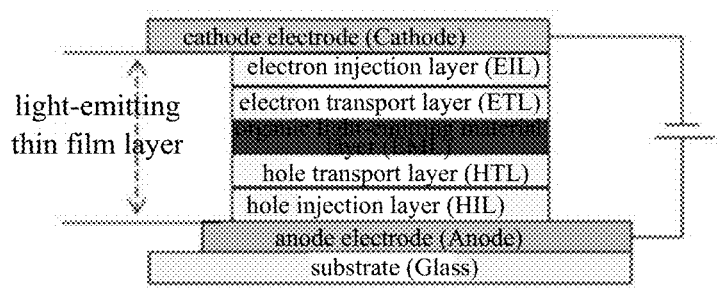
Figure 2:
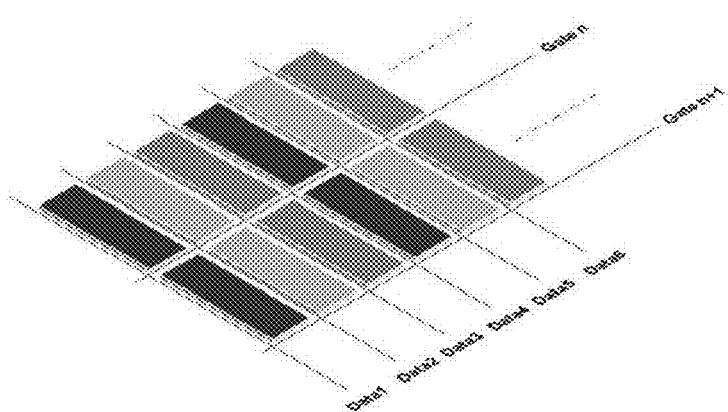
FIG. 2 illustrates a schematic diagram of pixel arrangement of an AMOLED display in the prior art.
Figure 3:
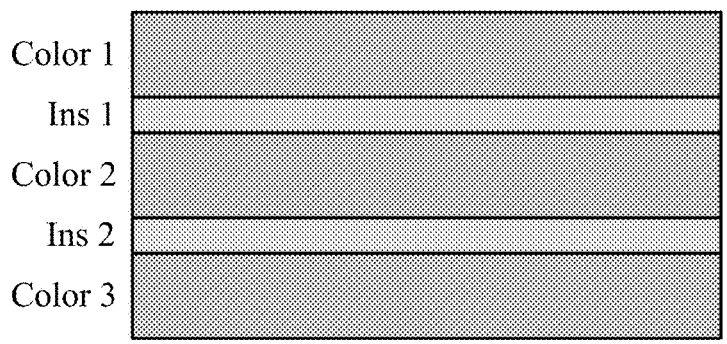
FIG. 3 illustrates an exemplary structural block diagram of a full-color OLED pixel according to one embodiment of the present disclosure.

FIG. 3 is an exemplary structural block diagram of the full-color OLED pixel of the embodiments of the present disclosure.

As shown in FIG. 3, the full-color OLED pixel comprises three color thin film layers stacked and insulating layers arranged between any two adjacent color thin film layers. Particularly, the full-color OLED pixel shown in FIG. 3 comprises a first color thin film layer Color1, an insulating layer Ins1, a second color thin film layer Color2, an insulating layer Ins2, and a third color thin film layer Color3 in a stack order. The first color thin film layer Color1 is configured to emit light having a first color, the second color thin film layer Color2 is configured to emit light having a second color, and the third color thin film layer Color3 is configured to emit light having a third color. For example, the first color thin film layer Color1, the second color thin film layer Color2 and the third color thin film layer Color3 may be a combination of a red thin film layer, a green thin film layer and a blue thin film layer in any order.

Furthermore, as shown in FIG. 3, the three color thin film layers and the insulating layers of the full-color OLED pixel are transparent layers.

Figure 4:
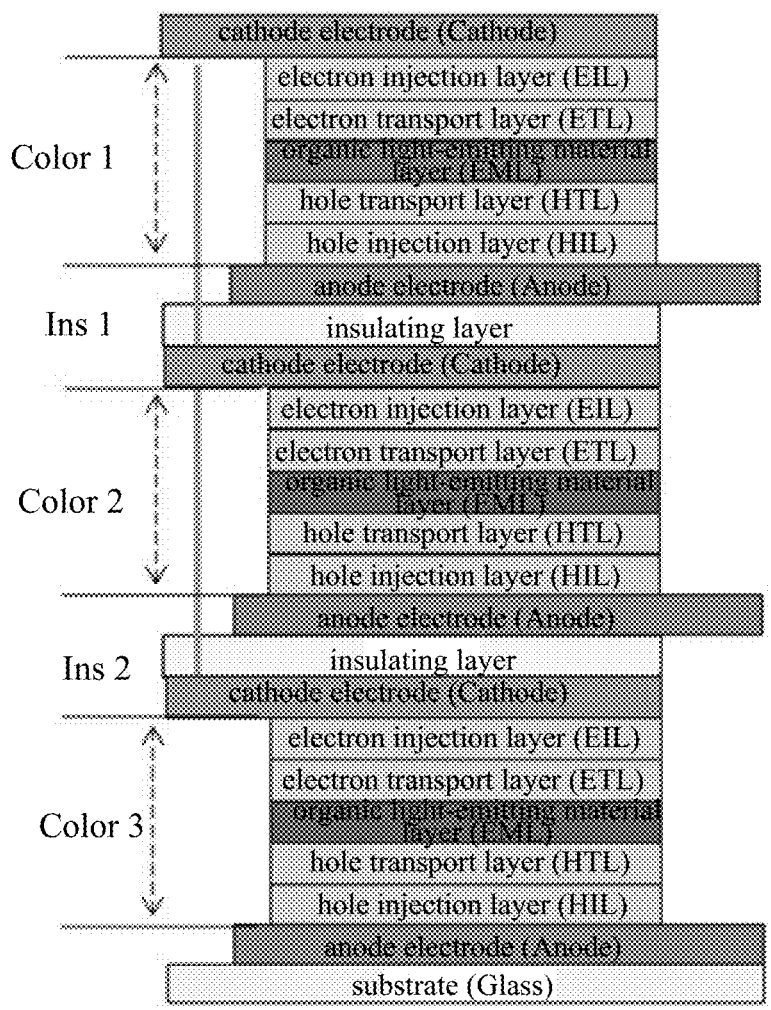
FIG. 4 illustrates a detailed structural block diagram of the full-color OLED pixel as shown in FIG. 3.

FIG. 4 illustrates a detailed structural block diagram of the full-color OLED pixel as shown in FIG. 3.

As shown in FIG. 4, each of the first color thin film layer Color1, the second color thin film layer Color2 and the third color thin film layer Color3 comprises an electron injection layer (EIL), an electron transport layer (ETL), an emitting material layer (EML), a hole transport layer (HTL) and a hole injection layer (HIL).

Furthermore, each of the first color thin film layer Color1, the second color thin film layer Color2 and the third color thin film layer Color3 further comprises a cathode electrode (Cathode) and an anode electrode (Anode). The cathode electrode may be a metal negative electrode, and the anode electrode may be an Indium Tin Oxide (ITO) electrode.

For each of the first color thin film layer Color1, the second color thin film layer Color2 and the third color thin film layer Color3, the luminance of the color thin film layer can be controlled by controlling a current flowing from the anode electrode to the cathode electrode thereof according to the data voltage corresponding thereto. Any combination of the first color, the second color and the third color can be achieved by controlling the luminance of each of the color thin film layers in the full-color OLED pixel structure separately since each of the color thin film layers and each of the insulating layers are transparent layers. In case that the first color, the second color and the third color are three primary colors, the full-color display can be achieved. Therefore, each of the color thin film layers functions as a display functional layer of the full-color OLED pixel.

Figure 5:
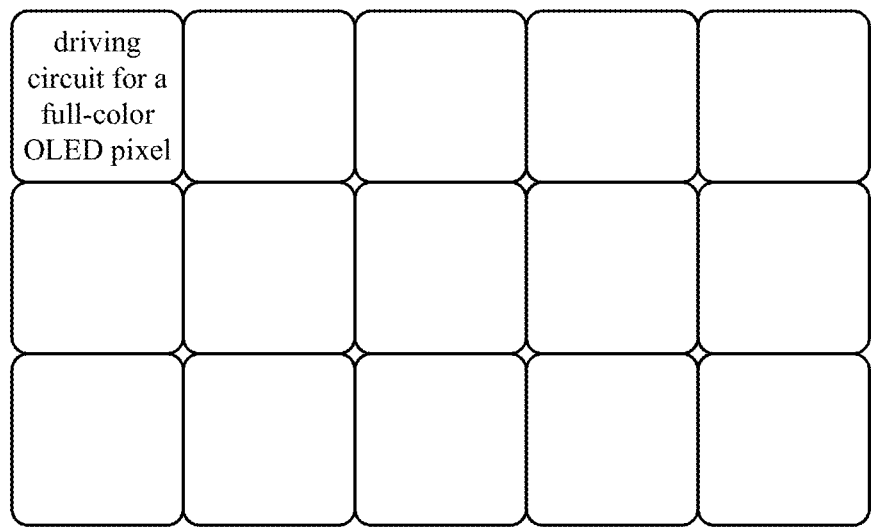
FIG. 5 and FIG. 6 illustrate arrangement of the full-color OLED pixel and a driving circuit for the full-color OLED pixel according to one embodiment of the present disclosure.
Figure 6:
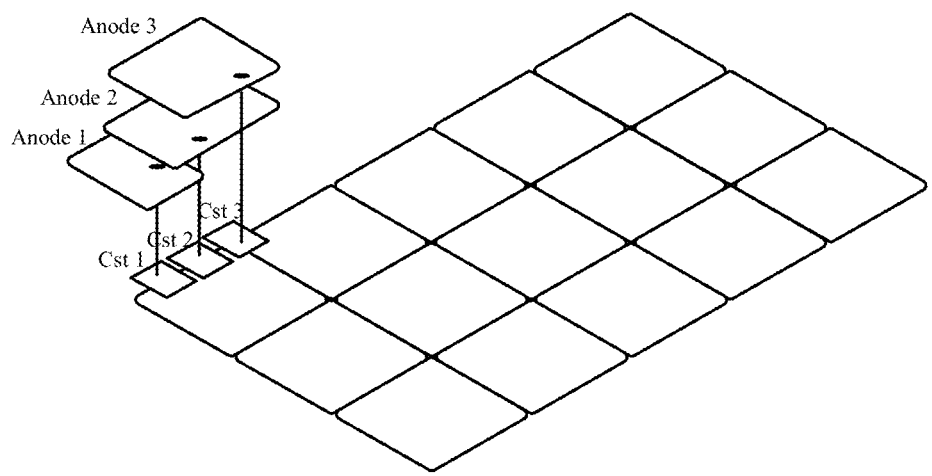

FIG. 5 and FIG. 6 illustrate arrangement of the full-color OLED pixel and a driving circuit for the full-color OLED pixel according to one embodiment of the present disclosure.

As shown in FIG. 5, the driving circuit for the full-color OLED pixel is arranged on the full-color OLED pixel, and size of the full-color OLED pixel can be set according to size of the driving circuit for the full-color OLED pixel.

As shown in FIG. 6, the driving circuit for the full-color OLED pixel can supply a driving current for each of the color thin film layers of the full-color OLED pixel. Based on such arrangement, a driving circuit for a plurality of color thin film layers of a full-color OLED pixel can be formed on the full-color OLED pixel and can supply a driving current for an anode electrode of each of the color thin film layers separately, and thus a real full-color display of the full-color OLED pixel can be achieved. In FIG. 6, the driving circuit is illustrated as three parts Cst1, Cst2 and Cst3 which supply driving currents for the anode electrodes of the three color thin film layers respectively. However, the present application is not so limited, and the driving circuit may be a whole circuit instead of being formed by three separate parts.

According to one embodiment of the present application, the driving circuit for the full-color OLED pixel comprises at least two driving sub-circuits connected to a same data line and a same light-emitting control terminal, and each of the driving sub-circuits is connected to a scanning control terminal corresponding thereto and is configured to drive the color thin film layer corresponding thereto. The at least two driving sub-circuits read data signals on the data line in sequence under the control of the respective scanning control terminals, and drive the respective color thin film layers to emit light concurrently under the control of the light-emitting control terminal.

Description will be given below by taking that the first, the second and the third color thin film layers correspond to three primary colors respectively as an example. Herein, the three primary colors may be red-green-blue three primary colors, but the present application is not so limited.

Figure 7:
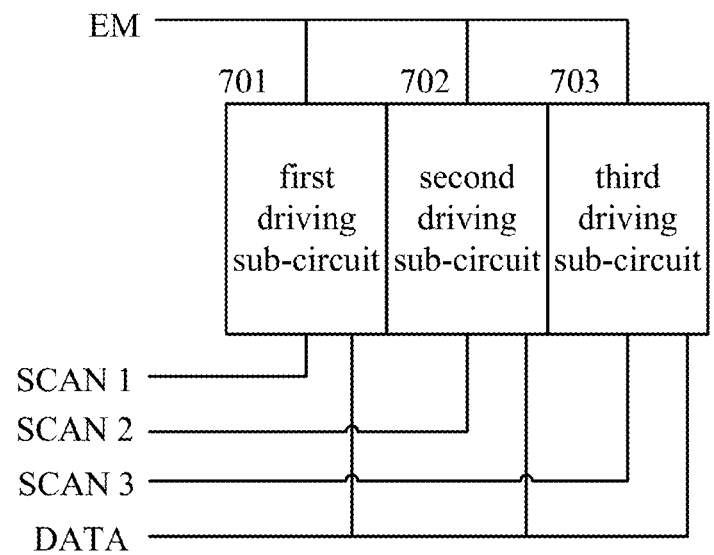
FIG. 7 illustrates a schematic structural block diagram of a driving circuit of the full-color OLED pixel according to one embodiment of the present disclosure.

FIG. 7 illustrates a schematic structural block diagram of the driving circuit for the full-color OLED pixel according to one embodiment of the present disclosure.

As shown in FIG. 7, the driving circuit for the full-color OLED pixel comprises a first driving sub-circuit 701, a second driving sub-circuit 702 and a third driving sub-circuit 703. Furthermore, the driving circuit for the full-color OLED pixel is further connected to a data line DATA, three scanning control terminals SCAN1-SCAN3 and a light-emitting control terminal EM.

The first driving sub-circuit 701 is connected to a first scanning control terminal SCAN1, the data line DATA and the light-emitting control terminal EM, and is configured to drive the first color thin film layer.

The second driving sub-circuit 702 is connected to a second scanning control terminal SCAN2, the data line DATA and the light-emitting control terminal EM, and is configured to drive the second color thin film layer.

The third driving sub-circuit 703 is connected to a third scanning control terminal SCAN3, the data line DATA and the light-emitting control terminal EM, and is configured to drive the third color thin film layer.

The first driving sub-circuit 701, the second driving sub-circuit 702 and the third driving sub-circuit 703 read the data signals on the data line DATA in sequence under the control of a first scanning control signal at the first scanning control terminal SCAN1, a second scanning control signal at the second scanning control terminal SCAN2 and a third scanning control signal at the third scanning control terminal SCAN3.

The first driving sub-circuit 701, the second driving sub-circuit 702 and the third driving sub-circuit 703 drive the first color thin film layer, the second color thin film layer and the third color thin film layer respectively to emit light concurrently under the control of a light-emitting control signal at the light-emitting control terminal EM.

Figure 8:
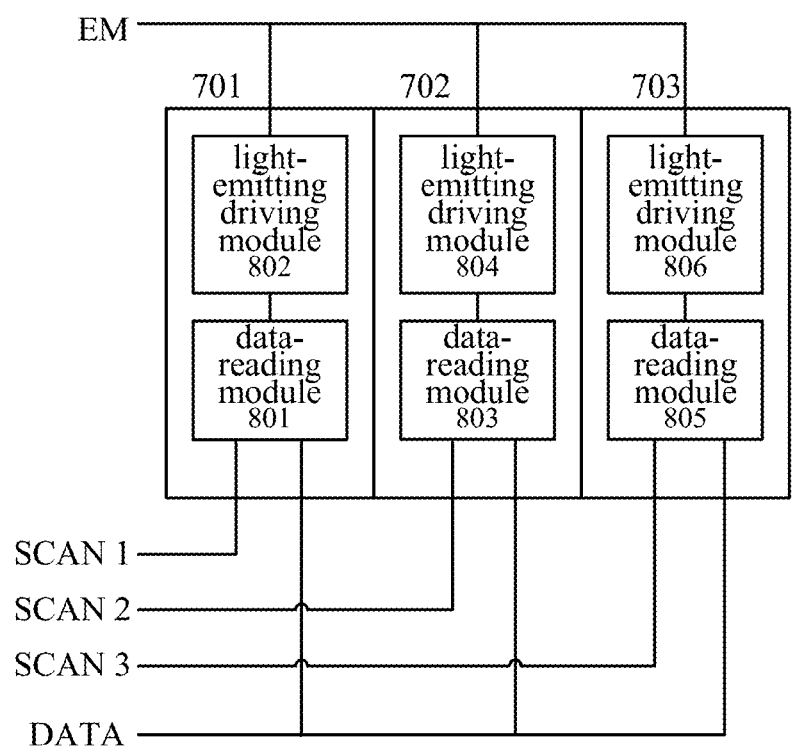
FIG. 8 illustrates a detailed structural block diagram of a driving circuit of the full-color OLED pixel according to a first embodiment of the present disclosure.

FIG. 8 illustrates a detailed structural block diagram of a driving circuit for the full-color OLED pixel according to a first embodiment of the present disclosure.

As shown in FIG. 8, the first driving sub-circuit 701 comprises a data-reading module 801 and a light-emitting driving module 802; the second driving sub-circuit 702 comprises a data-reading module 803 and a light-emitting driving module 804; and the third driving sub-circuit 703 comprises a data-reading module 805 and a light-emitting driving module 806.

The data-reading modules 801, 803 and 805 read and store data signals on the data line DATA respectively. Particularly, the data-reading module 801 is connected to the first scanning control terminal SCAN1 and the data line DATA, and read and store a data signal on the data line DATA under the control of the first scanning control terminal SCAN1; the data-reading module 803 is connected to the second scanning control terminal SCAN2 and the data line DATA, and read and store a data signal on the data line DATA under the control of the second scanning control terminal SCAN2; and the data-reading module 805 is connected to the third scanning control terminal SCAN3 and the data line DATA, and read and store a data signal on the data line DATA under the control of the third scanning control terminal SCAN3.

The light-emitting driving modules 802, 804 and 806 drive the first, the second and the third color thin film layers to emit light respectively. Particularly, the light-emitting driving modules 802, 804 and 806 are all connected to the light-emitting control terminal EM, and drive the first, the second and the third color thin film layers respectively to emit light concurrently under the control of the light-emitting control terminal EM.

Figure 9:
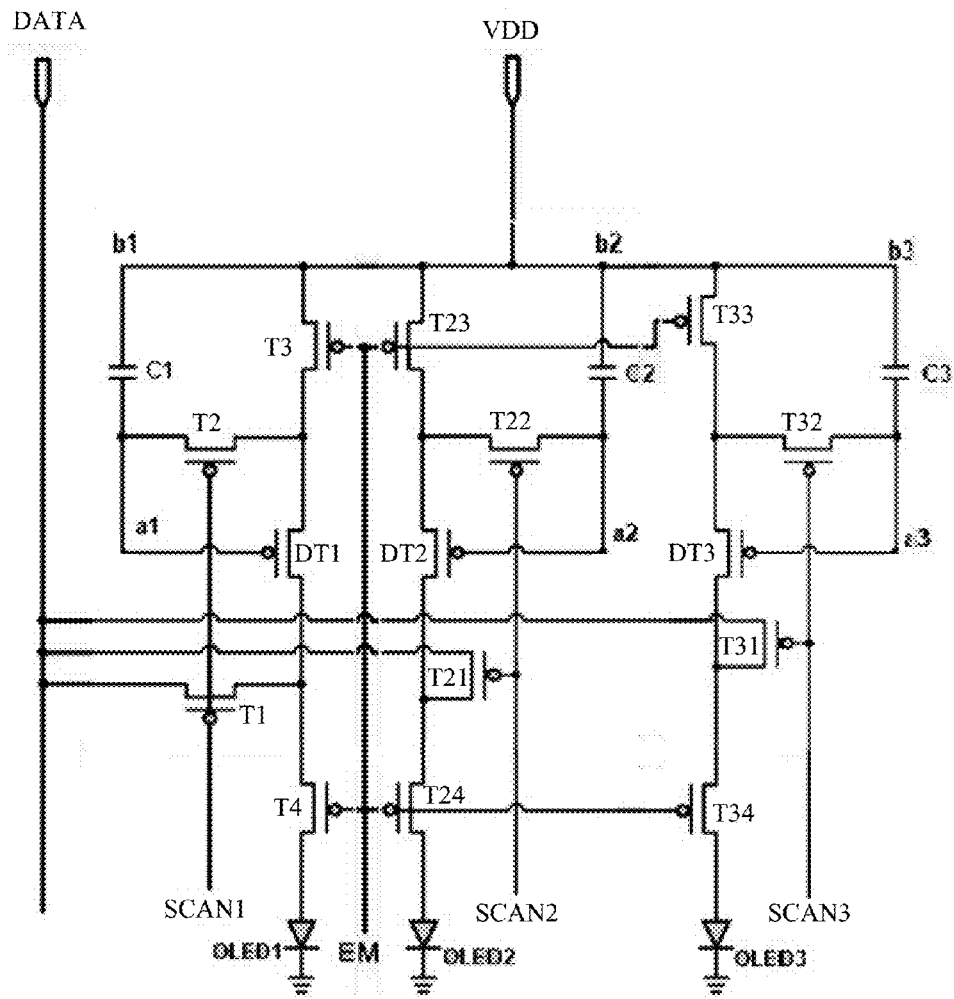
FIG. 9 illustrates a schematic circuit diagram of the driving circuit of the full-color OLED pixel as shown in FIG. 8 according to the first embodiment of the present disclosure.

FIG. 9 illustrates a schematic circuit diagram of the driving circuit for the full-color OLED pixel as shown in FIG. 8 according to the first embodiment of the present disclosure. The circuit configuration and operation of the driving circuit for the full-color OLED pixel will be described below by taking the first driving sub-circuit 701 as an example.

In the accompanying drawings, for sake of simple illustration, the first color thin film layer is illustrated as OLED1, the second color thin film layer is illustrated as OLED2 and the third color thin film layer is illustrated as OLED3.

As shown in FIG. 9, the first driving sub-circuit 701 comprises a first switching transistor T1, a second switching transistor T2, a third switching transistor T3, a fourth switching transistor T4, a first driving transistor DT1 and a first capacitor C1. The first switching transistor T1, the second switching transistor T2 and the first capacitor C1 constitute the data-reading module 801; the third switching transistor T3, the fourth switching transistor T4 and the first driving transistor DT1 constitute the light-emitting driving module 802.

In the data-reading module 801, the first switching transistor T1 has a gate connected to the first scanning control terminal SCAN1, a first electrode connected to the data line DATA and a second electrode connected to a second electrode of the first driving transistor DT1; the second switching transistor T2 has a gate connected to the first scanning control terminal SCAN1, a first electrode connected to a first electrode a1 of the first capacitor C1 and a second electrode connected to a first electrode of the first driving transistor DT1; the first capacitor C1 has a second electrode b1 connected to a first level supply terminal VDD. For example, the first level supply terminal VDD is a high level supply terminal.

When the first scanning control signal at the first scanning control terminal SCAN1 is at an active control level, the first switching transistor T1 is turned on such that a data signal on the data line DATA is applied to the second electrode of the first driving transistor DT1; and the second switching transistor T2 is turned on such that the gate and the first electrode of the first driving transistor DT1 are connected.

When the first scanning control terminal SCAN1 is at an active control level, a reverse-charging current (that is, discharging current) of the first capacitor C1 origins from the data line DATA, flows through the first switching transistor T1, the first driving transistor DT1 and the second switching transistor T2 in sequence, and arrives at the first electrode a1 of the first capacitor C1.

Taking that the first driving transistor DT1 is a P type transistor as an example, a threshold voltage of the P type transistor has a negative value, a voltage at the gate is lower than a voltage at the source and a gate-source voltage of the P type transistor is lower than the threshold voltage thereof. In other words, an absolute value of the gate-source voltage of the P type transistor is higher than an absolute value of the threshold voltage thereof.

Specifically, the threshold voltage $V_{th1}$ of the first driving transistor DT1 has a negative value, and the first electrode of the first driving transistor DT1 is a drain and the second electrode of the first driving transistor DT1 is a source.

Until the absolute value of the gate-source voltage $V_{GS}$ of the first driving transistor DT1 is equal to the absolute value of the threshold voltage $V_{th1}$ of the first driving transistor DT1, the first capacitor C1 keeps to be charged reversely (discharged). Then, the first driving transistor D1 is turned off such that no reverse-charging current of the first capacitor C1 flows. That is, $|V_{GS}|=|V_G-V_S|=|V_G-V_{Data}|=|V_{th1}|$, where |•| represents sign of taking an absolute value. After removing sign of the absolute value, it can be obtained that: $V_{Data}-V_G=-V_{th1}$. Therefore, $V_G=V_{Data}+V_{th1}$.

At this time, voltage difference across the two electrodes of the first capacitor C1 is $V_{dd}-V_G=V_{dd}-V_{Data}-V_{th1}$, where $V_{th1}<0$, $V_{dd}$ is a first level at the first level supply terminal VDD, $V_{Data}$ is a data voltage on the data line DATA.

Therefore, not only the data voltage $V_{Data}$ on the data line DATA but also the threshold voltage $V_{th1}$ of the first driving transistor DT1 is held in the first capacitor C1.

In the light-emitting driving module 802, the third switching transistor T3 has a gate connected to the light-emitting control terminal EM, a first electrode connected to the first level supply terminal VDD, and a second electrode connected to the first electrode of the first driving transistor DT1 and the second electrode of the second switching transistor T2; the fourth switching transistor T4 has a gate connected to the light-emitting control terminal EM, a first electrode connected to the second electrode of the first driving transistor DT1, and a second electrode connected to an anode electrode of the first color thin film layer; and the first driving transistor DT1 has a gate connected to the first electrode a1 of the first capacitor C1.

When the first scanning control signal at the first scanning control terminal SCAN1 is at an inactive control level and the light-emitting control signal at the light-emitting control terminal EM is at an active control level, the third switching transistor T3 is turned on such that the first level $V_{dd}$ at the first level supply terminal VDD is applied to the first electrode of the first driving transistor DT1; and the fourth switching transistor T4 is turned on. At this time, the voltage at the gate of the first driving transistor DT1 is $V_G=V_{Data}+V_{th1}$ due to the voltage holding effect of the first capacitor C1. Therefore, When the first scanning control terminal SCAN1 is at an inactive control level and the light-emitting control terminal EM is at an active control level, the third switching transistor T3, the first driving transistor DT1 and the fourth switching transistor T4 are all turned on, a light-emitting driving current origins from the first level supply terminal VDD, flows through the third switching transistor T3, the first driving transistor DT1 and the fourth switching transistor T4, and arrives at the anode electrode of the first color thin film layer. At this time, the first electrode of the first driving transistor DT1 is a source and the second electrode of the first driving transistor DT1 is a drain.

The driving current flowing into the anode electrode of the first color thin film layer can be represented as:

$$I_{OLED1} = K(V_{GS} - V_{th1})^2$$
$$= K((V_{Data} + V_{th1} - V_{dd}) - V_{th1})^2$$
$$= K(V_{Data} - V_{dd})^2$$

It can be seen that the driving current flowing into the anode electrode of the first color thin film layer is irrelevant to the threshold voltage $V_{th1}$ of the first driving transistor DT1. In other words, not only the full-color display of the full-color OLED pixel can be achieved but also disadvantageous effect due to drift of the threshold voltage of the driving transistor can be removed by the driving circuit for the full-color OLED pixel according to the embodiments of the present disclosure.

In FIG. 9, the cathode electrodes of the first, the second and the third color thin film layers are all grounded, but the present disclosure is not so limited. The cathode electrodes of the first, the second and the third color thin film layers can be connected to a second level supply terminal VSS together. In case that the first level supply terminal VDD is a high level supply terminal, the second level supply terminal VSS is a low level supply terminal.

On the other hand, in order that display of each frame of image is not effected by display of its previous frame of image, that is, by the data voltage $V_{Data}$ stored in the first capacitor C1 during the process of display of the previous frame, a resetting module can also be incorporated into each of the driving sub-circuits in the driving circuit for the full-color OLED pixel as shown in FIG. 8 so as to reset the data-reading module to its initial state.

Figure 10:
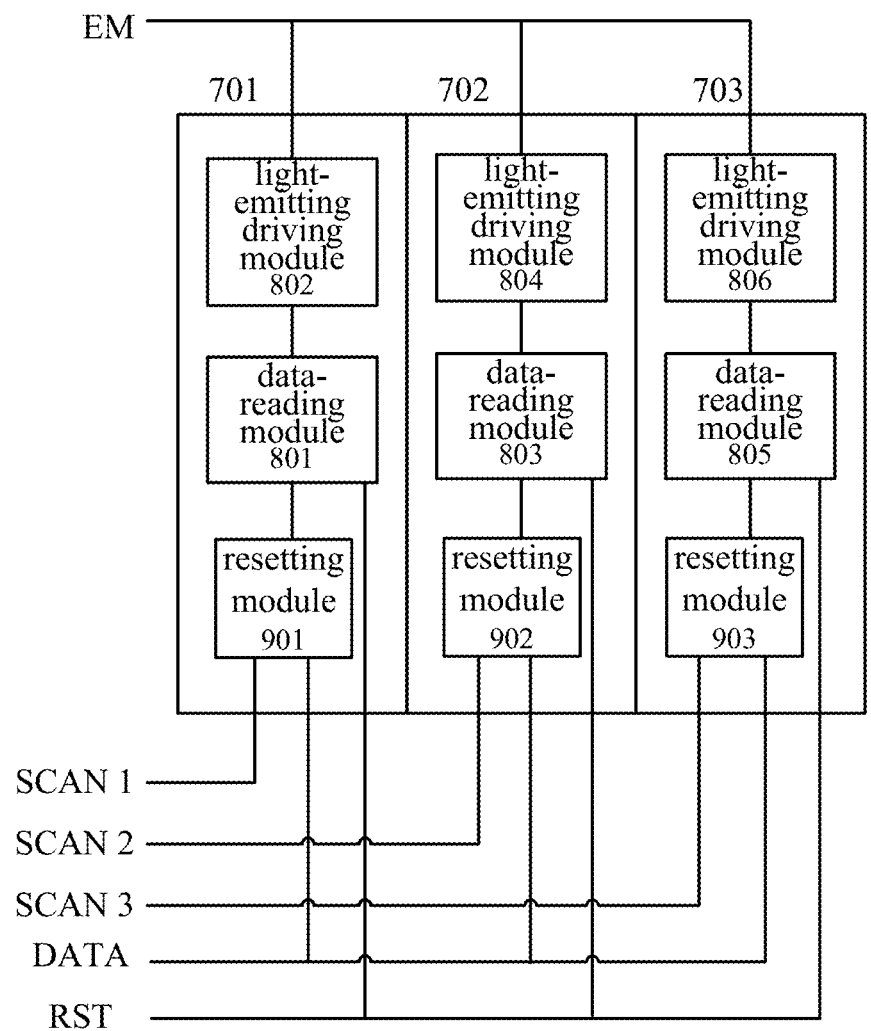
FIG. 10 illustrates a detailed structural block diagram of a driving circuit of the full-color OLED pixel according to a second embodiment of the present disclosure.

FIG. 10 illustrates a detailed structural block diagram of a driving circuit of the full-color OLED pixel according to a second embodiment of the present disclosure.

As shown in FIG. 10, the first driving sub-circuit 701 comprises a data-reading module 801, a light-emitting driving module 802 and a resetting module 901; the second driving sub-circuit 702 comprises a data-reading module 803, a light-emitting driving module 804 and a resetting module 902; and the third driving sub-circuit 703 comprises a data-reading module 805, a light-emitting driving module 806 and a resetting module 903.

The configuration and operation of the data-reading modules 801, 803 and 805 in the second embodiment of the present disclosure are same as those of the data-reading modules 801, 803 and 805 in the first embodiment of the present disclosure, and detailed description is no repeated herein.

The configuration and operation of the light-emitting driving modules 802, 804 and 806 in the second embodiment of the present disclosure are same as those of the light-emitting driving modules 802, 804 and 806 in the first embodiment of the present disclosure, and detailed description is no repeated herein.

Figure 11:
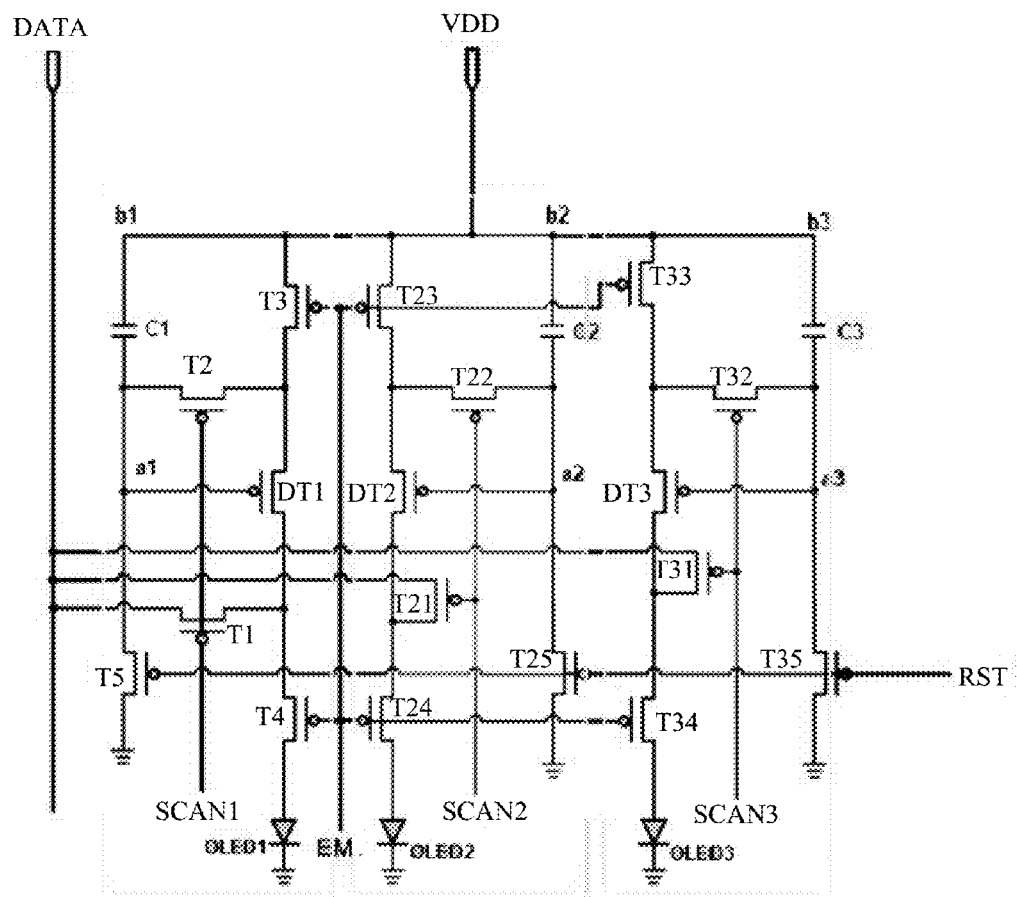
FIG. 11 illustrates a schematic circuit diagram of the driving circuit of the full-color OLED pixel as shown in FIG. 10 according to the second embodiment of the present disclosure.

FIG. 11 illustrates a schematic circuit diagram of the driving circuit for the full-color OLED pixel as shown in FIG. 10 according to the second embodiment of the present disclosure. The circuit configuration and operation of the driving circuit for the full-color OLED pixel will be described below by taking the first driving sub-circuit 701 as an example.

As shown in FIG. 11, the first driving sub-circuit 701 comprises a first switching transistor T1, a second switching transistor T2, a third switching transistor T3, a fourth switching transistor T4, a fifth switching transistor T5, a first driving transistor DT1 and a first capacitor C1. The first switching transistor T1, the second switching transistor T2 and the first capacitor C1 constitute the data-reading module 801; the third switching transistor T3, the fourth switching transistor T4 and the first driving transistor DT1 constitute the light-emitting driving module 802; and the fifth switching transistor T5 constitutes the resetting module 901.

The configuration and operation of the data-reading module 801 in the second embodiment of the present disclosure are same as those of the data-reading module 801 in the first embodiment of the present disclosure, and detailed description is no repeated herein.

The configuration and operation of the light-emitting driving module 802 in the second embodiment of the present disclosure are same as those of the light-emitting driving module 802 in the first embodiment of the present disclosure, and detailed description is no repeated herein.

In the resetting module 901, the fifth switching transistor T5 has a gate connected to a resetting control terminal RST, a first electrode connected to the first electrode a1 of the first capacitor C1 and the gate of the first driving transistor DT1, and a second electrode connected to the second level supply terminal VSS.

When the resetting control signal at the resetting control terminal RST is at an active control level, the fifth switching transistor T5 is turned on, and the first capacitor C1 is charged such that the voltage difference across the two electrodes of the first capacitor C1 is equal to difference between the voltage at the first level supply terminal VDD and the voltage at the second level supply terminal VSS.

Although the first to fifth switching transistors T1-T5 and the driving transistor DT1 are illustrated as P type transistors in the circuit structure in FIG. 9 and FIG. 11, the embodiments of the present disclosure are not so limited. It should be understood that each of the first to fifth switching transistors T1-T5 and the driving transistor DT1 may be an N type transistor or a P type transistor in the embodiments of the present disclosure. In case that the first and second switching transistors T1 and T2 share the first scanning control terminal SCAN1, it should be ensured that the first and second switching transistors T1 and T2 are transistors having a same type; in case that the third and fourth switching transistors T3 and T4 share the light-emitting control terminal EM, it should be ensured that the third and fourth switching transistors T3 and T4 are transistors having a same type.

As an example, the first and second switching transistors T1 and T2 are N type switching transistors, the third and fourth switching transistors T3 and T4 are P type switching transistors, and the fifth switching transistor is an N type switching transistor. At this time, the active control level of the first scanning control signal at the first scanning control terminal SCAN1 is a high level, and the active control level of the light-emitting control signal at the light-emitting control terminal EM is a low level, and the active control level of the resetting control signal at the resetting control terminal RST is a high level.

As another example, the first and second switching transistors T1 and T2 are N type switching transistors, the third and fourth switching transistors T3 and T4 are N type switching transistors, and the fifth switching transistor is a P type switching transistor. At this time, the active control level of the first scanning control signal at the first scanning control terminal SCAN1 is a high level, and the active control level of the light-emitting control signal at the light-emitting control terminal EM is a high level, and the active control level of the resetting control signal at the resetting control terminal RST is a low level.

As another example, the first driving transistor DT1 is an N type driving transistor. It is easily understood by those skilled in the art that the connection relationship of the first capacitor C1, the fifth switching transistor T5, the first switching transistor T1 and the second switching transistor T2 may be adjusted accordingly.

As another example, the first to fifth switching transistors T1-T5 are all N type switching transistors, and the first driving transistor is an N type or a P type driving transistor. At this time, the active control levels of the control signals at the first scanning control terminal SCAN1, the light-emitting control terminal EM and the resetting control terminal RST are all a high level.

Operation of the driving circuit for the full-color OLED pixel according to the embodiments of the present disclosure may comprise at least two data-reading periods and one light-emitting period. During the at least two data-reading periods, the at least two driving sub-circuits read and store data signals on the data line in sequence, and during each of the data-reading periods, only one of the driving sub-circuits reads and stores a data signal on the data line; during the light-emitting period, the at least two sub-circuits drive the at least two color thin film layers respectively to emit light concurrently.

Operation of the driving circuit for the full-color OLED pixel according to the first embodiment of the present disclosure will be described below with reference to FIG. 12, FIG. 13, FIG. 14, FIG. 15 and FIG. 16.

Figure 12:
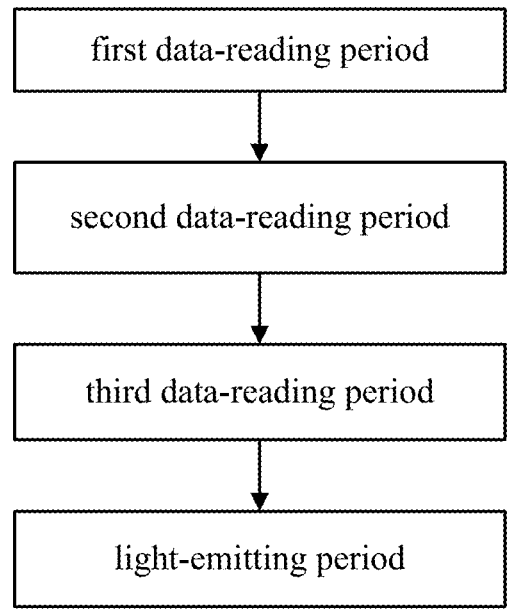
FIG. 12 illustrates a schematic flowchart of an operation method of the driving circuit of the full-color OLED pixel according to the first embodiment of the present disclosure.

FIG. 12 illustrates a schematic flowchart of an operation method of the driving circuit of the full-color OLED pixel according to the first embodiment of the present disclosure.

During a first data-reading period, the first driving sub-circuit reads and stores a first data signal on the data line.

During a second data-reading period, the second driving sub-circuit reads and stores a second data signal on the data line.

During a third data-reading period, the third driving sub-circuit reads and stores a third data signal on the data line.

During a light-emitting period, the first driving sub-circuit, the second driving sub-circuit and the third driving sub-circuit drive the first color thin film layer, the second color thin film layer and the third color thin film layer respectively to emit light concurrently.

As shown in FIG. 10, the driving circuit for the full-color OLED pixel according to the second embodiment of the present disclosure comprises a resetting module which can reset all of the first driving sub-circuit, the second driving sub-circuit and the third driving sub-circuit to their initial state after the light-emitting period or before the data-reading period.

Figure 13:
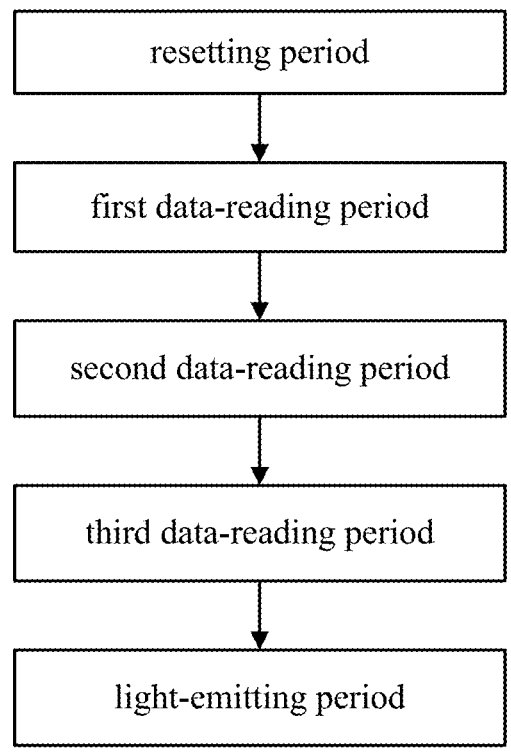
FIG. 13 illustrates a schematic flowchart of an operation method of the driving circuit of the full-color OLED pixel according to the second embodiment of the present disclosure.

FIG. 13 illustrates a schematic flowchart of an operation method of the driving circuit of the full-color OLED pixel according to the second embodiment of the present disclosure.

During a resetting period, the first driving sub-circuit, the second driving sub-circuit and the third driving sub-circuit are all reset to their initial state.

During a first data-reading period, the first driving sub-circuit reads and stores a first data signal on the data line.

During a second data-reading period, the second driving sub-circuit reads and stores a second data signal on the data line.

During a third data-reading period, the third driving sub-circuit reads and stores a third data signal on the data line.

During a light-emitting period, the first driving sub-circuit, the second driving sub-circuit and the third driving sub-circuit drive the first color thin film layer, the second color thin film layer and the third color thin film layer respectively to emit light concurrently.

Figure 14:
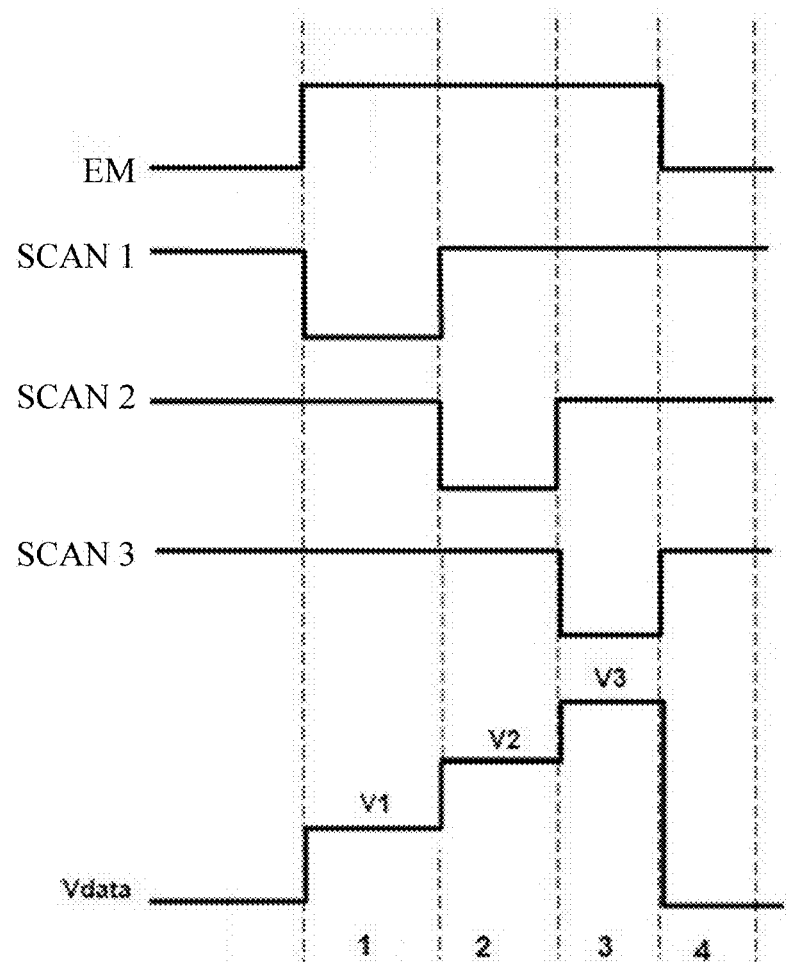
FIG. 14 illustrates a signal sequence diagram of the driving circuit of the full-color OLED pixel according to the first embodiment of the present disclosure.

FIG. 14 illustrates a signal sequence diagram of the driving circuit of the full-color OLED pixel according to the first embodiment of the present disclosure.

During the first data-reading period (1), the first scanning control signal at the first scanning control terminal SCAN1 is at a low level, the second scanning control signal at the second scanning control terminal SCAN2 and the third scanning control signal at the third scanning control terminal SCAN3 are at a high level, and the light-emitting control signal at the light-emitting control terminal EM is at a high level.

Figure 15:
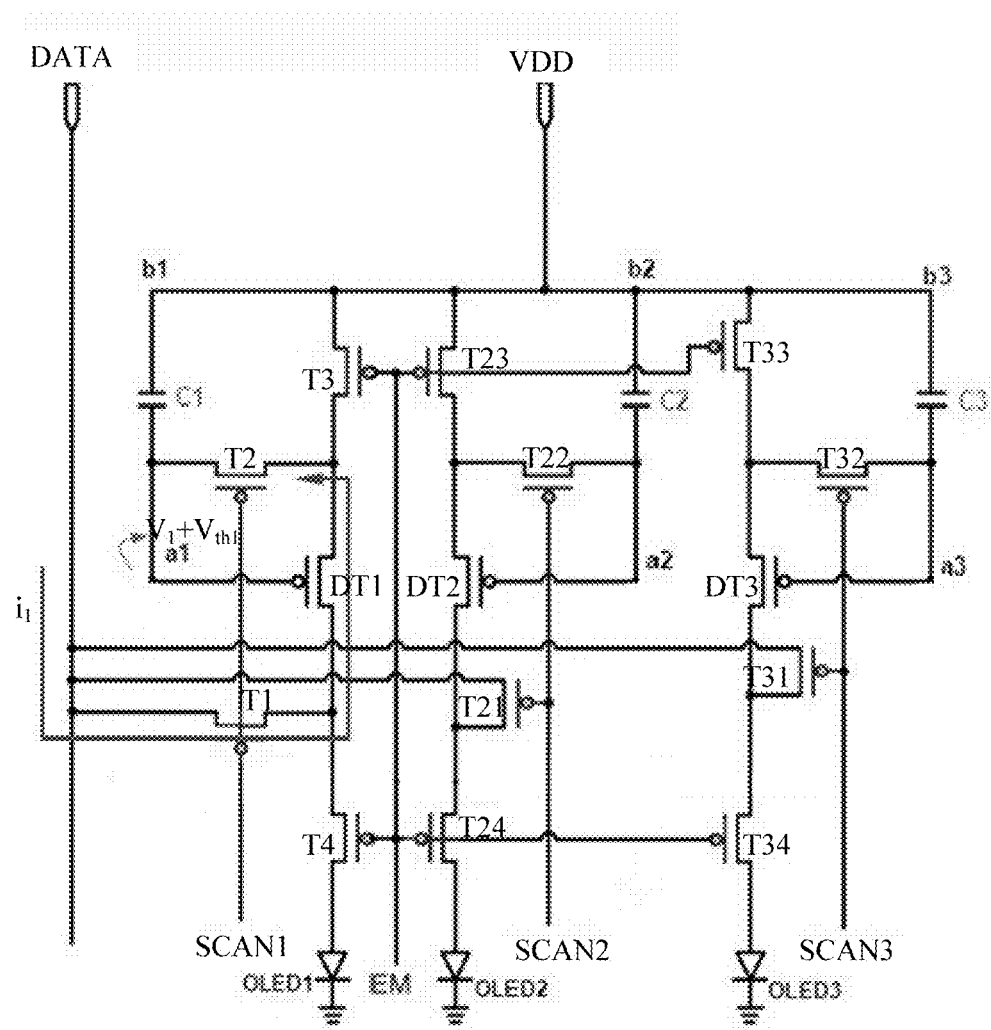
FIG. 15 illustrates a schematic operation diagram of the driving circuit of the full-color OLED pixel during a first data-reading period according to the first embodiment of the present disclosure.

As shown in FIG. 15, during the first data-reading period, since the first scanning control signal at the first scanning control terminal SCAN1 is at a low level, the first switching transistor T1 is turned on such that the data voltage V1 on the data line DATA is applied to the second electrode of the first driving transistor DT1; and the second switching transistor T2 is turned on such that the gate and the first electrode of the first driving transistor DT1 are connected. At this time, the discharging current i1 of the first capacitor C1 origins from the data line DATA, flows through the first switching transistor T1, the first driving transistor DT1 and the second switching transistor T2 in sequence, and arrives at the first electrode a1 of the first capacitor C1. Specifically, the discharging current i1 flows from the second electrode of the first driving transistor DT1 to the first electrode of the first driving transistor DT1, and arrives at the first electrode a1 of the first capacitor C1 via the second switching transistor T2.

At the end of the first data-reading period, as described above, the voltage at the first electrode a1 of the first capacitor C1 is $V1+V_{th1}$ and the absolute value of the gate-source voltage of the first driving transistor DT1 is equal to the absolute value of the threshold voltage of the first driving transistor DT1 at this time, such that the first driving transistor DT1 is turned off. Accordingly, the first data voltage V1 on the data line DATA and the threshold voltage $V_{th1}$ of the first driving transistor DT1 are stored in the first capacitor C1.

During the first data-reading period, the second driving sub-circuit 702 and the third driving sub-circuit 703 do not operate.

During the second data-reading period (2), the second scanning control signal at the second scanning control terminal SCAN2 is at a low level, the first scanning control signal at the first scanning control terminal SCAN1 and the third scanning control signal at the third scanning control terminal SCAN3 are at a high level, and the light-emitting control signal at the light-emitting control terminal EM is at a high level.

Figure 16:
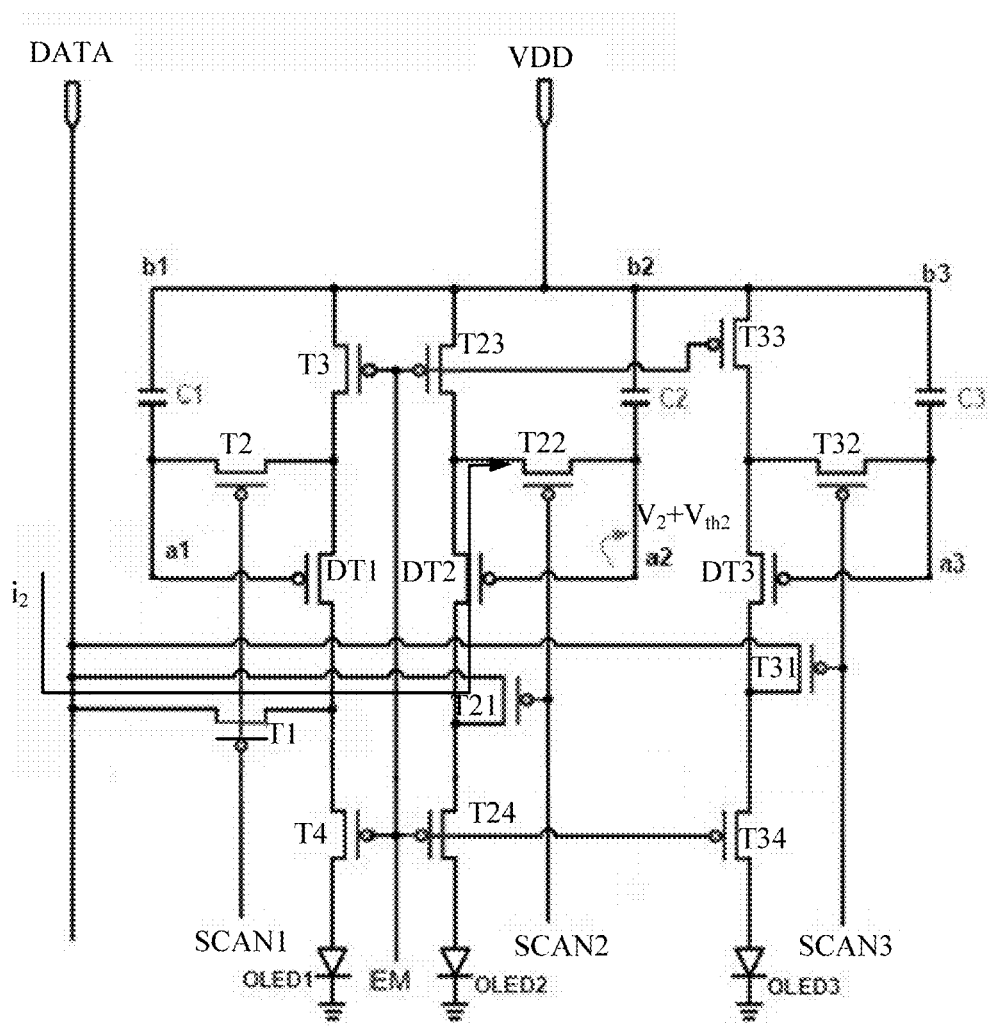
FIG. 16 illustrates a schematic operation diagram of the driving circuit of the full-color OLED pixel during a second data-reading period according to the first embodiment of the present disclosure.

As shown in FIG. 16, during the second data-reading period, since the second scanning control signal at the second scanning control terminal SCAN2 is at a low level, the twenty-first switching transistor T21 is turned on such that the data voltage V2 on the data line DATA is applied to the second electrode of the second driving transistor DT2; and the twenty-second switching transistor T22 is turned on such that the gate and the first electrode of the second driving transistor DT2 are connected. At this time, the discharging current i2 of the second capacitor C2 origins from the data line DATA, flows through the twenty-first switching transistor T21, the second driving transistor DT2 and the twenty-second switching transistor T22 in sequence, and arrives at the first electrode a2 of the second capacitor C2.

At the end of the second data-reading period, the voltage at the first electrode a2 of the second capacitor C2 is $V2+V_{th2}$ and the absolute value of the gate-source voltage of the second driving transistor DT2 is equal to the absolute value of the threshold voltage of the second driving transistor DT2 at this time, such that the second driving transistor DT2 is turned off. Accordingly, the second data voltage V2 on the data line DATA and the threshold voltage $V_{th2}$ of the second driving transistor DT2 are stored in the second capacitor C2.

During the second data-reading period, the first driving sub-circuit 701 and the third driving sub-circuit 703 do not operate, and the first capacitor C1 in the first driving sub-circuit 701 keeps the voltage across the two electrodes thereof unchanged.

During the third data-reading period (3), the third scanning control signal at the third scanning control terminal SCAN3 is at a low level, the first scanning control signal at the first scanning control terminal SCAN1 and the second scanning control signal at the second scanning control terminal SCAN2 are at a high level, and the light-emitting control signal at the light-emitting control terminal EM is at a high level.

Figure 17:
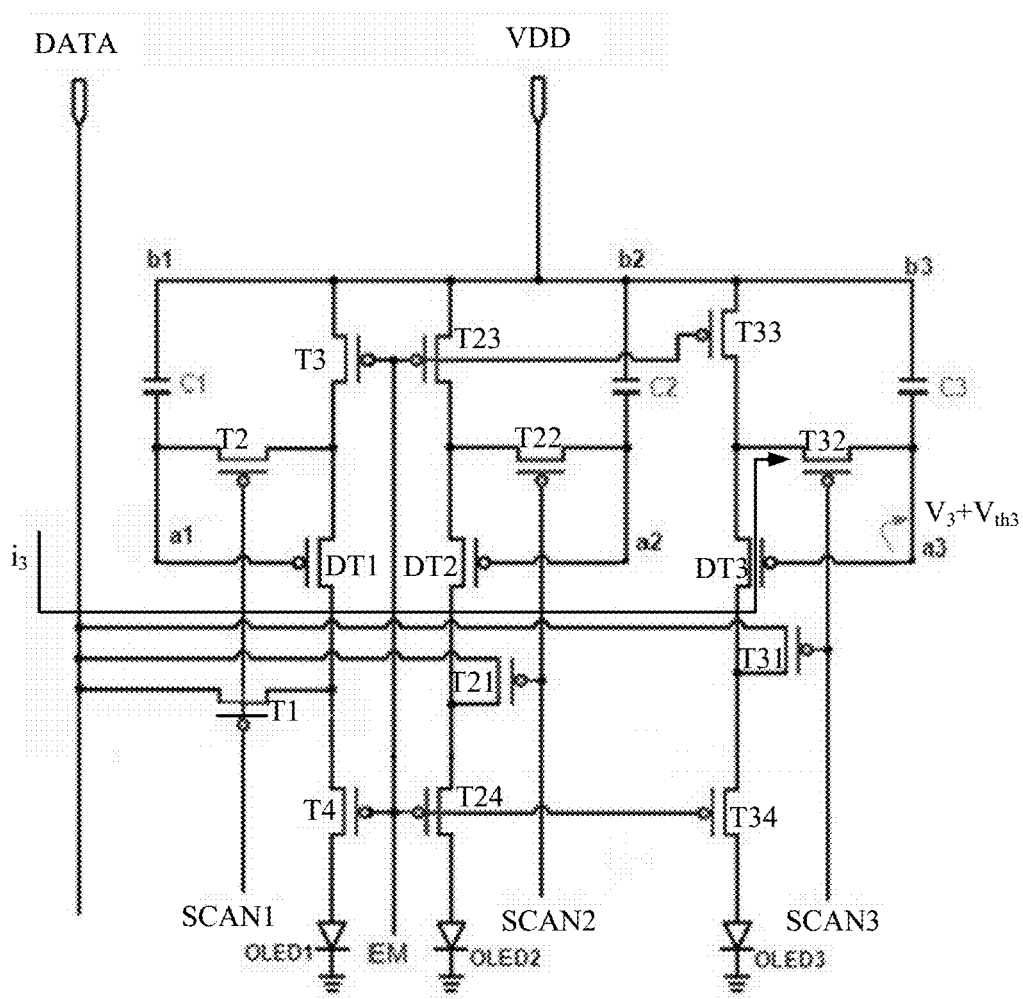
FIG. 17 illustrates a schematic operation diagram of the driving circuit of the full-color OLED pixel during a third data-reading period according to the first embodiment of the present disclosure.

As shown in FIG. 17, during the third data-reading period, since the third scanning control signal at the third scanning control terminal SCAN3 is at a low level, the thirty-first switching transistor T31 is turned on such that the data voltage V3 on the data line DATA is applied to the second electrode of the third driving transistor DT3; and the thirty-second switching transistor T32 is turned on such that the gate and the first electrode of the third driving transistor DT3 are connected. At this time, the discharging current i3 of the third capacitor C3 origins from the data line DATA, flows through the thirty-first switching transistor T31, the third driving transistor DT3 and the thirty-second switching transistor T32 in sequence, and arrives at the first electrode a3 of the third capacitor C3.

At the end of the third data-reading period, the voltage at the first electrode a3 of the third capacitor C3 is $V3+V_{th3}$ and the absolute value of the gate-source voltage of the third driving transistor DT3 is equal to the absolute value of the threshold voltage of the third driving transistor DT3 at this time, such that the third driving transistor DT3 is turned off. Accordingly, the third data voltage V3 on the data line DATA and the threshold voltage $V_{th3}$ of the third driving transistor DT3 are stored in the third capacitor C3.

During the third data-reading period, the first driving sub-circuit 701 and the second driving sub-circuit 702 do not operate, and each of the first capacitor C1 in the first driving sub-circuit 701 and the second capacitor C2 in the second driving sub-circuit 702 keeps the voltage across the two electrodes thereof unchanged.

During the light-emitting period (4), the first scanning control signal at the first scanning control terminal SCAN1, the second scanning control signal at the second scanning control terminal SCAN2 and the third scanning control signal at the third scanning control terminal SCAN3 are at a high level, and the light-emitting control signal at the light-emitting control terminal EM is at a low level.

Figure 18:
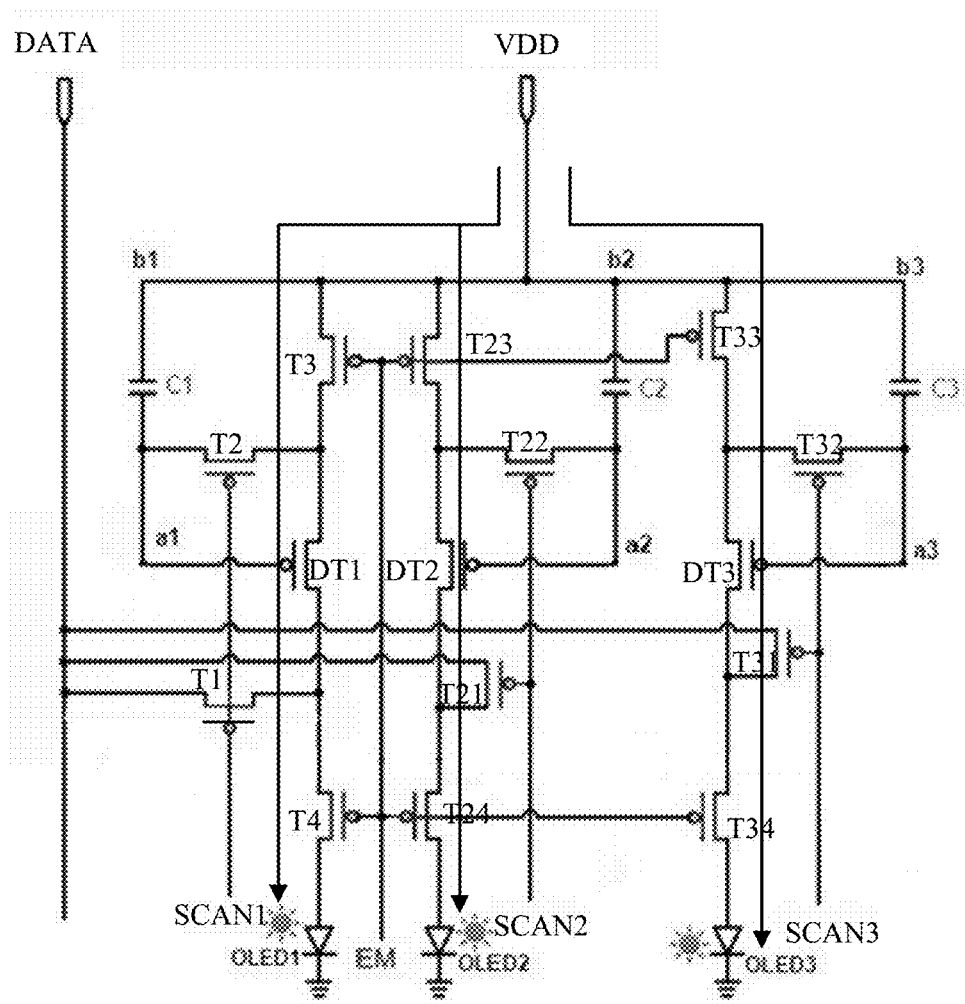
FIG. 18 illustrates a schematic operation diagram of the driving circuit of the full-color OLED pixel during a light-emitting period according to the first embodiment of the present disclosure.

As shown in FIG. 18, during the light-emitting period, since the light-emitting control signal at the light-emitting control terminal EM is at a low level, the third switching transistor T3 is turned on such that the first level Vdd at the first level supply terminal VDD is applied to the first electrode of the first driving transistor DT1, and the fourth switching transistor T4 is turned on; similarly, the twenty-third switching transistor T23 is turned on such that the first level Vdd at the first level supply terminal VDD is applied to the first electrode of the second driving transistor DT2, and the twenty-fourth switching transistor T24 is turned on; similarly, the thirty-third switching transistor T33 is turned on such that the first level Vdd at the first level supply terminal VDD is applied to the first electrode of the third driving transistor DT3, and the thirty-fourth switching transistor T34 is turned on.

At this time, the voltage at the gate of the first driving transistor DT1 is $V_{G1}=V1+V_{th1}$ due to the voltage holding effect of the first capacitor C1; the voltage at the gate of the second driving transistor DT2 is $V_{G2}=V2+V_{th2}$ due to the voltage holding effect of the second capacitor C2; and the voltage at the gate of the third driving transistor DT3 is $V_{G3}=V3+V_{th3}$ due to the voltage holding effect of the third capacitor C3. $V_{th1}$ is a threshold voltage of the first driving transistor DT1, $V_{th2}$ is a threshold voltage of the second driving transistor DT2, and $V_{th3}$ is a threshold voltage of the third driving transistor DT3.

At this time, the light-emitting driving current of the first color thin film layer origins from the first level supply terminal VDD, flows through the third switching transistor T3, the first driving transistor DT1 and the fourth switching transistor T4, and arrives at the anode electrode of the first color thin film layer. Specifically, the light-emitting driving current of the first color thin film layer flows from the first electrode of the first driving transistor DT1 to the second electrode of the first driving transistor DT1. During this period, the first color thin film layer is driven to emit light by the data voltage V1 and the threshold voltage $V_{th1}$ of the first driving transistor DT1 stored in the first capacitor C1, such that effect of drift of the threshold voltage of the first driving transistor DT1 on the luminance of the first color thin film layer is compensated.

Similarly, the light-emitting driving current of the second color thin film layer origins from the first level supply terminal VDD, flows through the twenty-third switching transistor T23, the second driving transistor DT2 and the twenty-fourth switching transistor T24, and arrives at the anode electrode of the second color thin film layer; the light-emitting driving current of the third color thin film layer origins from the first level supply terminal VDD, flows through the thirty-third switching transistor T33, the third driving transistor DT3 and the thirty-fourth switching transistor T34, and arrives at the anode electrode of the third color thin film layer.

The current flowing into the anode electrode of the first color thin film layer can be represented as:

$$I_{OLED1} = K(V_{GS1} - V_{th1})^2$$
$$= K((V1 + V_{th1} - V_{dd}) - V_{th1})^2$$
$$= K(V1 - V_{dd})^2$$

The current flowing into the anode electrode of the second color thin film layer can be represented as:

$$I_{OLED2} = K(V_{GS2} - V_{th2})^2$$
$$= K((V2 + V_{th2} - V_{dd}) - V_{th2})^2$$
$$= K(V2 - V_{dd})^2$$

The current flowing into the anode electrode of the third color thin film layer can be represented as:

$$I_{OLED3} = K(V_{GS3} - V_{th3})^2$$
$$= K((V3 + V_{th3} - V_{dd}) - V_{th3})^2$$
$$= K(V3 - V_{dd})^2$$

It can be seen that the current flowing into the anode electrode of the first color thin film layer is irrelevant to the threshold voltage $V_{th1}$ of the first driving transistor DT1, the current flowing into the anode electrode of the second color thin film layer is irrelevant to the threshold voltage $V_{th2}$ of the second driving transistor DT2, and the current flowing into the anode electrode of the third color thin film layer is irrelevant to the threshold voltage $V_{th3}$ of the third driving transistor DT3. In other words, not only the full-color display of the full-color OLED pixel can be achieved but also disadvantageous effect due to drift of the threshold voltage of the driving transistor can be removed by the driving circuit for the full-color OLED pixel according to the embodiments of the present disclosure.

Figure 19:
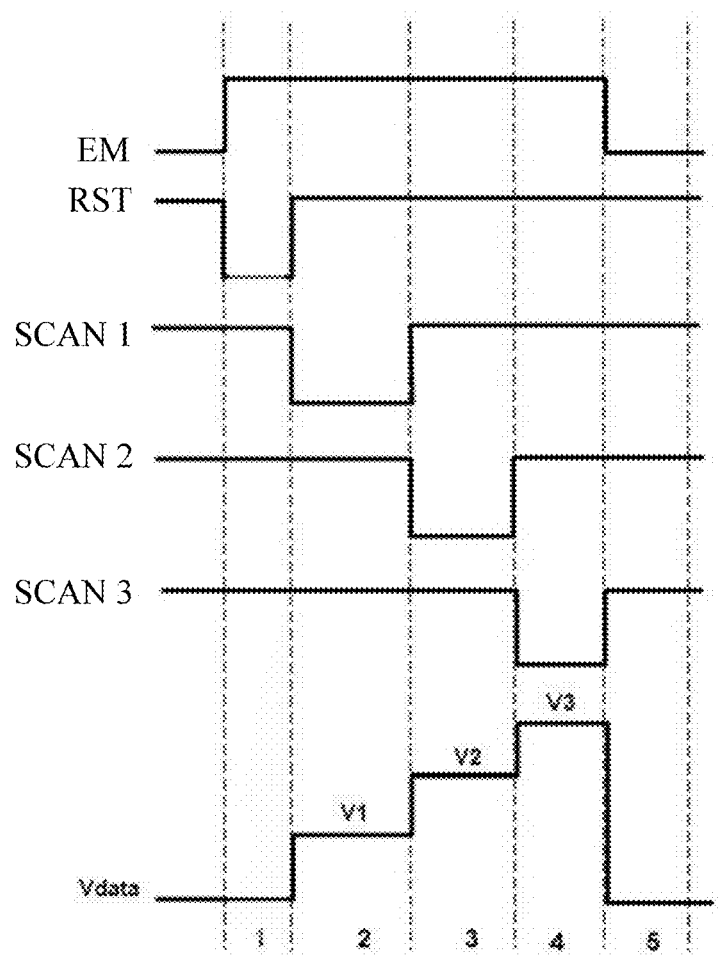
FIG. 19 illustrates a signal sequence diagram of the driving circuit of the full-color OLED pixel according to the second embodiment of the present disclosure.

FIG. 19 illustrates a signal sequence diagram of the driving circuit of the full-color OLED pixel according to the second embodiment of the present disclosure.

During a resetting period (1), the first scanning control signal at the first scanning control terminal SCAN1, the second scanning control signal at the second scanning control terminal SCAN2 and the third scanning control signal at the third scanning control terminal SCAN3 are at a high level, the light-emitting control signal at the light-emitting control terminal EM is at a high level, and the resetting control signal at the resetting control terminal RST is at a low level.

Figure 20:
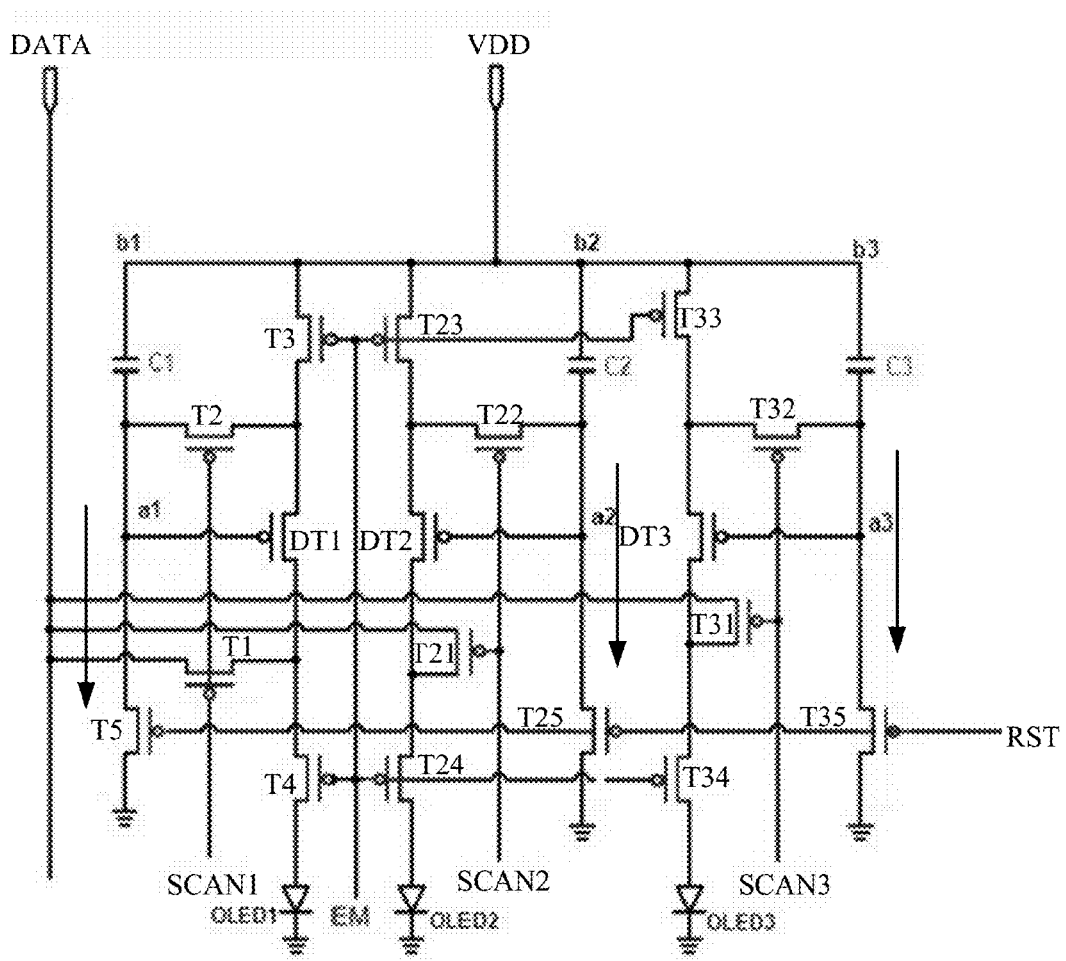
FIG. 20 illustrates a schematic operation diagram of the driving circuit of the full-color OLED pixel according to the second embodiment of the present disclosure.

As shown in FIG. 20, during the resetting period, the fifth switching transistor T5, the twenty-fifth switching transistor T25 and the thirty-fifth switching transistor T35 are turned on so as to charge the first capacitor C1, the second capacitor C2 and the third capacitor C3 respectively, such that the voltage across the two electrodes of each of the first capacitor C1, the second capacitor C2 and the third capacitor C3 is equal to difference between the voltage of the first level supply terminal VDD and the voltage of the second level supply terminal VSS.

During a first data-reading period (2), the first scanning control signal at the first scanning control terminal SCAN1 is at a low level, the second scanning control signal at the second scanning control terminal SCAN2 and the third scanning control signal at the third scanning control terminal SCAN3 are at a high level, the light-emitting control signal at the light-emitting control terminal EM is at a high level, and the resetting control signal at the resetting control terminal RST is at a high level.

During a second data-reading period (3), the second scanning control signal at the second scanning control terminal SCAN2 is at a low level, the first scanning control signal at the first scanning control terminal SCAN1 and the third scanning control signal at the third scanning control terminal SCAN3 are at a high level, the light-emitting control signal at the light-emitting control terminal EM is at a high level, and the resetting control signal at the resetting control terminal RST is at a high level.

During a third data-reading period (4), the third scanning control signal at the third scanning control terminal SCAN3 is at a low level, the first scanning control signal at the first scanning control terminal SCAN1 and the second scanning control signal at the second scanning control terminal SCAN2 are at a high level, the light-emitting control signal at the light-emitting control terminal EM is at a high level, and the resetting control signal at the resetting control terminal RST is at a high level.

During a light-emitting period (5), the first scanning control signal at the first scanning control terminal SCAN1, the second scanning control signal at the second scanning control terminal SCAN2 and the third scanning control signal at the third scanning control terminal SCAN3 are at a high level, the light-emitting control signal at the light-emitting control terminal EM is at a low level, and the resetting control signal at the resetting control terminal RST is at a high level.

Operations of the driving circuit for the full-color OLED pixel according to the second embodiment of the present disclosure in the first data-reading period, the second data-reading period, the third data-reading period and light-emitting period are same as those of the driving circuit for the full-color OLED pixel according to the first embodiment of the present disclosure in the first data-reading period, the second data-reading period, the third data-reading period and light-emitting period, and detailed description is no repeated herein.

According to the embodiments of the present disclosure, there is further provided a substrate array comprising an array of full-color OLED pixels, each of the full-color OLED pixels comprises the pixel structure of the full-color OLED pixel and the driving circuit for the full-color OLED pixel according to the embodiments of the present disclosure.

According to the embodiments of the present disclosure, there is further provided a full-color AMOLED display comprising an array of pixels each of which being constituted by the pixel structure of the full-color OLED pixel and the driving circuit for the full-color OLED pixel according to the embodiments of the present disclosure.

According to the embodiments of the present disclosure, in a stacked AMOLED pixel structure, at least two color thin film layers are stacked and share a common cathode electrode, such that any mixture of three primary display colors can be displayed by every pixel, thus achieving extreme full-color display on the pixel level and improving display effect of the AMOLED display.

In addition, as compared to the AMOLED pixel structure in the art, data transmission for three color thin film layers can be implemented by one data line and data reading can be implemented in sequence for the three color thin film layers according to three scanning control signals. Taking a row of N pixels as an example, the AMOLED display in the art requires one scanning control line and 3N data lines, whereas the full-color AMOLED display according to the embodiments of the present disclosure only requires N data lines and 3 scanning control lines. Therefore, with the driving circuit for the full-color AMOLED display according to the embodiments of the present disclosure, area of the driving circuit can be reduced significantly due to reduced number of the data lines, and thereby pitches among the full-color OLED pixels can be reduced, which is beneficial for resolution improvement of the full-color OLED display.

Various embodiments of the present disclosure have been described in detail. However, those skilled in the art should understand that various variations and improvements can be made without departing from the spirit and scope of the embodiments of the present disclosure, which should be considered as falling within the protection scope of the embodiments of the present disclosure.

This application claims priority to a Chinese Patent Application No. 201510243720.5, filed on May 13, 2015 in the China's State Intellectual Property Office, the disclosure of which is incorporated by reference herein as a whole.

What is claimed is:

1. A driving circuit for a full-color OLED pixel comprising at least two color thin film layers stacked and insulating layers arranged between any two adjacent thin film layers, comprising:

at least two driving sub-circuits which share a data line and a light-emitting control terminal, each of the driving sub-circuits connected to a scanning control terminal corresponding thereto and configured to drive the color thin film layer corresponding thereto, wherein the at least two driving sub-circuits read data signals on the data line in sequence under the control of the respective scanning control terminals, and drive the respective color thin film layers to emit light concurrently under the control of the light-emitting control terminal, wherein the at least two color thin film layers comprise a first color thin film layer, a second color thin film layer and a third color thin film layer, and the at least two driving sub-circuits comprise:
  a first driving sub-circuit connected to a first scanning control terminal, the data line and the light-emitting control terminal and configured to drive the first color thin film layer;
  a second driving sub-circuit connected to a second scanning control terminal, the data line and the light-emitting control terminal and configured to drive the second color thin film layer; and
  a third driving sub-circuit connected to a third scanning control terminal, the data line and the light-emitting control terminal and configured to drive the third color thin film layer, wherein the first driving sub-circuit, the second driving sub-circuit and the third driving sub-circuit read the data signals on the data line in sequence under the control of the first scanning control terminal, the second scanning control terminal and the third scanning control terminal; and the first driving sub-circuit, the second driving sub-circuit and the third driving sub-circuit drive the first color thin film layer, the second color thin film layer and the third color thin film layer respectively to emit light concurrently under the control of the light-emitting control terminal.

2. The driving circuit of claim 1, wherein each of the driving sub-circuits comprises:
  a data-reading module for reading and storing a data signal on the data line, and
  a light-emitting driving module for driving a color thin film layer corresponding thereto to emit light.

3. The driving circuit of claim 2, wherein the data-reading module is further configured to store a threshold voltage of a driving transistor in the light-emitting driving module, and the data-reading module comprises:
  a first switching transistor having a gate connected to the first scanning control terminal, a first electrode connected to the data line and a second electrode connected to a second electrode of the driving transistor;
  a second switching transistor having a gate connected to the first scanning control terminal and a second electrode connected to a first electrode of the driving transistor; and
  a capacitor having a first electrode connected to a first electrode of the second switching transistor and a second electrode connected to a first level supply terminal.

4. The driving circuit of claim 3, wherein the light-emitting driving module comprises:
  a third switching transistor having a gate connected to the light-emitting control terminal, a first electrode connected to the first level supply terminal, and a second electrode connected to the first electrode of the driving transistor and the second electrode of the second switching transistor;

a fourth switching transistor having a gate connected to the light-emitting control terminal, a first electrode connected to the second electrode of the driving transistor, and a second electrode connected to a first electrode of the color thin film layer corresponding thereto; and
  the driving transistor having a gate connected to the first electrode of the capacitor.

5. The driving circuit of claim 2, wherein the at least two driving sub-circuits further share a resetting control terminal, and each of the driving sub-circuits further comprises:
  a resetting module for resetting the data-reading module in the driving sub-circuit to its initial state under the control of the resetting control terminal.

6. The driving circuit of claim 5, wherein the resetting module comprises:
  a fifth switching transistor having a gate connected to the resetting control terminal, a first electrode connected to the first electrode of the capacitor and the gate of the driving transistor, and a second electrode connected to a second level supply terminal.

7. The driving circuit of claim 6, wherein
  the first level supply terminal is a high level supply terminal, the second level supply terminal is a low level supply terminal; and
  for each of the color thin film layers, the first electrode is an anode, and the second electrode is a cathode and is connected to the second level supply terminal.

8. A driving method of a driving circuit of a full-color OLED pixel comprising at least two color thin film layers stacked and insulating layers arranged between any two adjacent thin film layers, the driving circuit comprising at least two driving sub-circuits which share a data line and a light-emitting control terminal and each of which is connected to a scanning control terminal corresponding thereto and is configured to drive the color thin film layer corresponding thereto, the driving method comprising:
  during a data-reading period, the at least two driving sub-circuits reading data signals on the data line in sequence under the control of the respective scanning control terminals; and
  during a light-emitting period, the at least two driving sub-circuits driving the respective color thin film layers respectively to emit light concurrently under the control of the light-emitting control terminal,
  wherein the at least two color thin film layers comprise a first color thin film layer, a second color thin film layer and a third color thin film layer, and the at least two driving sub-circuits comprise a first driving sub-circuit, a second driving sub-circuit and a third driving sub-circuit, the first driving sub-circuit is connected to a first scanning control terminal, the data line and the light-emitting control terminal, the second driving sub-circuit is connected to a second scanning control terminal, the data line and the light-emitting control terminal, and the third driving sub-circuit is connected to a third scanning control terminal, the data line and the light-emitting control terminal,
  wherein the at least two driving sub-circuits reading data signals on the data line in sequence under the control of the respective scanning control terminals during the data-reading period comprises:
    during a first data-reading period, the first driving sub-circuit reading and storing a first data signal on the data line under the control of the first scanning control terminal;

during a second data-reading period, the second driving sub-circuit reading and storing a second data signal on the data line under the control of the second scanning control terminal; and during a third data-reading period, the third driving sub-circuit reading and storing a third data signal on the data line under the control of the third scanning control terminal, wherein the at least two driving sub-circuits driving the respective color thin film layers respectively to emit light concurrently under the control of the light-emitting control terminal during the light-emitting period comprises:

during the light-emitting period, the first driving sub-circuit, the second driving sub-circuit and the third driving sub-circuit drive the first color thin film layer, the second color thin film layer and the third color thin film layer respectively to emit light concurrently under the control of the light-emitting control terminal.

9. The driving method of claim 8, after the light-emitting period or before the data-reading period, the driving method further comprises:

during a resetting period, resetting each of the at least two driving sub-circuit to its initial state.

10. The driving method of claim 8, wherein during the first data-reading period, the first scanning control terminal is at a low level, the second scanning control terminal and the third scanning control terminal are at a high level, and the light-emitting control terminal is at a high level;

during the second data-reading period, the second scanning control terminal is at a low level, the first scanning control terminal and the third scanning control terminal are at a high level, and the light-emitting control terminal is at a high level;

during the third data-reading period, the third scanning control terminal is at a low level, the first scanning control terminal and the second scanning control terminal are at a high level, and the light-emitting control terminal is at a high level; and during the light-emitting period, the first scanning control terminal, the second scanning control terminal and the third scanning control terminal are at a high level, and the light-emitting control terminal is at a low level.

11. The driving method of claim 9, wherein the at least two driving sub-circuits further share a resetting control terminal, the resetting control terminal is at a low level during a resetting period and is at a high level during the data-reading period and the light-emitting period, wherein during the resetting period, the respective scanning control terminals and the light-emitting control terminal are at a high level.

12. The driving method of claim 8, wherein each of the driving sub-circuits comprises a data-reading module and a light-emitting driving module, the data-reading module comprises: a first switching transistor having a gate connected to the first scanning control terminal, a first electrode connected to the data line and a second electrode connected to a second electrode of a driving transistor in the light-emitting driving module; a second switching transistor having a gate connected to the first scanning control terminal and a second electrode connected to a first electrode of the driving transistor; and a capacitor having a first electrode connected to a first electrode of the second switching transistor and a second electrode connected to a first level supply terminal;

the light-emitting driving module comprises: a third switching transistor having a gate connected to the light-emitting control terminal, a first electrode connected to the first level supply terminal, and a second electrode connected to the first electrode of the driving transistor and the second electrode of the second switching transistor; a fourth switching transistor having a gate connected to the light-emitting control terminal, a first electrode connected to the second electrode of the driving transistor, and a second electrode connected to a first electrode of the color thin film layer corresponding thereto; and the driving transistor having a gate connected to the first electrode of the capacitor.

13. The driving method of claim 12, wherein the driving sub-circuits share a resetting control terminal, and each of the driving sub-circuits further comprises a resetting module for resetting the data-reading module to its initial state, the resetting module comprises a fifth switching transistor having a gate connected to the resetting control terminal, a first electrode connected to the first electrode of the capacitor and the gate of the driving transistor, and a second electrode connected to a second level supply terminal.

14. The driving method of claim 12, wherein the at least two color thin film layers comprise a first color thin film layer, a second color thin film layer and a third color thin film layer, and the at least two driving sub-circuits comprise a first driving sub-circuit, a second driving sub-circuit and a third driving sub-circuit, the first driving sub-circuit is connected to a first scanning control terminal, the data line and the light-emitting control terminal, the second driving sub-circuit is connected to a second scanning control terminal, the data line and the light-emitting control terminal, and a third driving sub-circuit is connected to a third scanning control terminal, the data line and the light-emitting control terminal, wherein the at least two driving sub-circuits reading data signals on the data line in sequence under the control of the respective scanning control terminals during the data-reading period comprises:

during a first data-reading period, the first scanning control terminal is at a low level, the second scanning control terminal and the third scanning control terminal are at a high level, and the light-emitting control terminal is at a high level, a data signal on the data line is a first data signal, the first switching transistor and the second switching transistor in the first driving sub-circuit are turned on, the driving transistor in the first driving sub-circuit is turned on such that the capacitor stores the first data signal and the threshold voltage of the driving transistor;

during the second data-reading period, the second scanning control terminal is at a low level, the first scanning control terminal and the third scanning control terminal are at a high level, and the light-emitting control terminal is at a high level, a data signal on the data line is a second data signal, such that the capacitor in the second driving sub-circuit stores the second data signal and the threshold voltage of the driving transistor in the second driving sub-circuit, the capacitor in the first driving sub-circuit keeps the voltage across its two electrodes unchanged;

during the third data-reading period, the third scanning control terminal is at a low level, the first scanning control terminal and the second scanning control terminal are at a high level, and the light-emitting control terminal is at a high level, a data signal on the data line is a third data signal, such that the capacitor in the third driving sub-circuit stores the third data signal and the threshold voltage of the driving transistor in the third driving sub-circuit, the capacitor in the first driving sub-circuit keeps the voltage across its two electrodes unchanged and the capacitor in the second driving sub-circuit keeps the voltage across its two electrodes unchanged;

wherein the at least two sub-circuits driving the respective color thin film layers to emit light concurrently under the control of the light-emitting control terminal during the light-emitting period comprises:

during the light-emitting period, the first scanning control terminal, the second scanning control terminal and the third scanning control terminal are at a high level, and the light-emitting control terminal is at a low level, the driving transistor in the first driving sub-circuit is turned on and drives the first color thin film layer to emit light, the driving transistor in the second driving sub-circuit is turned on and drives the second color thin film layer to emit light, and the driving transistor in the third driving sub-circuit is turned on and drives the third color thin film layer to emit light.

15. The driving method of claim 13, wherein during the resetting period, the respective scanning control terminals and the light-emitting control terminal are at a high level, the resetting control terminal is at a low level, the fifth switching transistor in the resetting module of each of the driving sub-circuits is turned on, such that a voltage of the first electrode of the capacitor in each of the driving sub-circuits is reset to a voltage at the second level supply terminal.

16. The driving method of claim 14, wherein for each of the driving sub-circuits, during the data-reading period corresponding thereto, a first current origins from the data line, flows through the first switching transistor, the driving transistor and the second switching transistor in sequence, and arrives at the first electrode of the capacitor in the driving sub-circuit; and during the light-emitting period, a second current origins from the first level supply terminal, flows through the third switching transistor, the driving transistor and the fourth switching transistor in sequence, and arrives at the first electrode of the color thin film layer corresponding to the driving sub-circuit.

17. The driving method of claim 16, wherein for each of the driving sub-circuits, during the data-reading period corresponding thereto, the first current flows from the second electrode of the driving transistor to the first electrode of the driving transistor, during the light-emitting period, the second current flows from the first electrode of the driving transistor to the second electrode of the driving transistor; and for each of the driving sub-circuits, during the light-emitting period, the color thin film layer corresponding thereto is driven to emit light by the data voltage corresponding thereto and the threshold voltage of the driving transistor corresponding thereto stored by the capacitor in the driving sub-circuit, so as to compensate for effect of drift of the threshold voltage of the driving transistor on luminance of the color thin film layer.

18. A full-color OLED display comprising an array of full-color OLED pixels, wherein each of the full-color OLED pixels comprises the driving circuit of the full-color OLED pixel of claim 1.

* * * * *